US012733205B2

(12) United States Patent
Furukawa

(10) Patent No.: US 12,733,205 B2
(45) Date of Patent: Sep. 8, 2026

(54) SILICON CARBIDE BASED A METAL-OXIDE-SEMICONDUCTOR FIELD-EFFECT TRANSISTOR (MOSFET) INCLUDING DRIFT REGION WITH STACK OF N-TYPE AN P-TYPE IMPURITY REGIONS

(71) Applicants: Kabushiki Kaisha Toshiba, Tokyo (JP); Toshiba Electronic Devices & Storage Corporation, Tokyo (JP)

(72) Inventor: Masaru Furukawa, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 364 days.

(21) Appl. No.: 18/450,656

(22) Filed: Aug. 16, 2023

(65) Prior Publication Data

US 2024/0313104 A1 Sep. 19, 2024

(30) Foreign Application Priority Data

Mar. 17, 2023 (JP) ................................ 2023-043639

(51) Int. Cl.
*H10D 30/66* (2025.01)
*H10D 62/10* (2025.01)
*H10D 62/832* (2025.01)

(52) U.S. Cl.
CPC ........... *H10D 30/66* (2025.01); *H10D 62/127* (2025.01); *H10D 62/8325* (2025.01)

(58) Field of Classification Search
CPC .. H10D 30/66; H10D 62/127; H10D 62/8325; H10D 12/031; H10D 62/111;
(Continued)

(56) References Cited

U.S. PATENT DOCUMENTS 9,583,482 B2 2/2017 Matocha et al.
9,887,285 B1 2/2018 Oota et al.
(Continued)

FOREIGN PATENT DOCUMENTS

JP 2014131008 A 7/2014
JP 2018-049951 A 3/2018
(Continued)

OTHER PUBLICATIONS

Notice of Reasons for Refusal (Office Action) dated Jul. 21, 2026, mailed in counterpart Japanese Patent Application No. 2023-043639, with English translation, 13 pages.

*Primary Examiner* — Changhyun Yi
(74) *Attorney, Agent, or Firm* — Kim & Stewart LLP

(57) ABSTRACT

A semiconductor device according to an embodiment includes a silicon carbide layer having a first face and a second face; a first silicon carbide region of a first conductivity type; a second silicon carbide region of a second conductivity type; a third silicon carbide region of the first conductivity type in the silicon carbide layer in this order in a direction from the second face to the first face; and a gate electrode. The first silicon carbide region includes a first region, second regions, and third regions. The second regions and the third regions are provided between the first region and the second silicon carbide region. The second regions and the third regions are alternately provided in a first direction parallel to the first face, and the first conductivity type impurity concentration of the second regions is higher than those of the first region and the third regions.

19 Claims, 20 Drawing Sheets

(58) Field of Classification Search
CPC . H10D 62/393; H10D 30/668; H01L 29/7802
See application file for complete search history.

(56) References Cited

U.S. PATENT DOCUMENTS

| | | | | |
|---|---|---|---|---|
| 10,734,483 | B2 | 8/2020 | Mizukami et al. | |
| 11,489,046 | B2 | 11/2022 | Ohashi et al. | |
| 2014/0145209 | A1 | 5/2014 | Kumagai | |
| 2017/0040420 | A1* | 2/2017 | Mori | H10D 12/481 |
| 2020/0091295 | A1* | 3/2020 | Ohashi | H10D 62/393 |
| 2020/0161445 | A1 | 5/2020 | Miyamoto et al. | |
| 2020/0303494 | A1 | 9/2020 | Shimizu | |
| 2022/0416018 | A1 | 12/2022 | Matsunaga | |

FOREIGN PATENT DOCUMENTS

| | | | |
|---|---|---|---|
| JP | 2020-047683 | A | 3/2020 |
| JP | 2020-087954 | A | 6/2020 |
| JP | 2020155486 | A | 9/2020 |
| JP | 2020-161841 | A | 10/2020 |
| JP | 2022-164914 | A | 10/2022 |
| JP | 2023003117 | A | 1/2023 |

* cited by examiner

AA' CROSS-SECTION
SECOND DIRECTION
100
12
20
18
16
P1
n+
p+
n+
28
30
p
28
Py
n
Px
24d
26b
24b
26a
24
10
24a
n−
n+
22
P2
14

BB' CROSS-SECTION
SECOND DIRECTION
100
12
20
18
16
P1
n+
p+
n+
28
30
p
28
Py
n−
Px
24e
26b
24c
26a
24
10
24a
n−
n+
22
P2
14

SECOND DIRECTION
100
Py FACE
24a
26b
24a
26a
24a
FIRST DIRECTION
d1
n⁻
p
n⁻
p
n⁻

SECOND DIRECTION
100
Px FACE
24a
24a
24a
FIRST DIRECTION
24e
24d
24e
24d
24e
24d
24c
24b
24c
24b
24c
24b
dx
d3
d2
d4
d5
B
B'
A
A'
n⁻
n
n⁻

901
SECOND DIRECTION
12
20
18
16
P1
n+
p+
n+
28
30
p
28
Py
Px
24
10
26b
26a
24a
n−
n+
22
14
P2

Px FACE
SECOND DIRECTION
901
24a
FIRST DIRECTION
n−

901
12
20
18
16
P1
Py
Px
24a
22
P2
14
10
24
n+
p+
n+
28
30
p
28
26b
26a
n−
n+

902
SECOND DIRECTION
12
20
18
16
P1
n+
p+
n+
28
30
p
28
Py
Px
n
24d
26b
24b
26a
24
10
24a
n−
n+
22
P2
14

SECOND DIRECTION
902
Px FACE
24a
24a
24a
FIRST DIRECTION
n−
n
n−
n
n−
24d
24b

SECOND DIRECTION
FIRST DIRECTION
101
24a
24a
24a
24e
24d
24e
24d
24e
24d
24c
24b
24c
24b
24c
24b
n⁻
n
n⁻
n
n⁻
n
n⁻
n
n⁻
n
n⁻
n
n⁻
n⁻
n⁻
d3
d2

SECOND DIRECTION
FIRST DIRECTION
102
24a
24a
24a
24d
24e
24d
24e
24d
24e
24c
24b
24c
24b
24c
24b
n
n⁻
n
n⁻
n
n⁻
n⁻
n
n⁻
n
n⁻
n
n⁻
n⁻
n⁻

DD' CROSS-SECTION
SECOND DIRECTION
200
20
18
16
P1
Py
Px
24a
22
P2
28
26c
24g
30
24x
26a
24c
26b
24e
12
24
10
14

200
SECOND DIRECTION
FIRST DIRECTION
Px FACE
24a
24b
24c
24d
24e
24f
24g
D
D'
C
C'
n
n⁻

EE' CROSS-SECTION
SECOND DIRECTION
300
12
20
18
16
P1
Py
Px
n+
p+
n+
28
30
p
28
n
24d
26b
24b
26a
24
10
24a
n−
n+
22
P2
14

FF' CROSS-SECTION
SECOND DIRECTION
300
12
20
18
16
P1
Py
Px
n+
p+
n+
28
30
p
28
n−
24e
26b
24c
26a
24
10
24a
n−
n+
22
P2
14

Py FACE
SECOND DIRECTION
FIRST DIRECTION
300
24a
p
p
26b
26a
p
n⁻
p
p
p

Px FACE
300
24a
n⁻
n
n⁻
n
24e
24b
F
F'
24d
24c
E
E'
24e
24b
24d
24c
24e
24b

GG' CROSS-SECTION
SECOND DIRECTION
400
12
20
P1
18
Py
Px
16
n+
p+
n+
n+
p+
n+
28
30
p
28
28
30
p
28
n
n
24
10
24d
26b
24b
26a
40
24a
n−
n+
22
P2
14

HH' CROSS-SECTION
SECOND DIRECTION
400
12
20
P1
18
Py
Px
16
n+
p+
n+
n+
p+
n+
28
30
p
28
28
30
p
28
n−
n−
24
10
24e
26b
24c
26a
40
24a
n−
n+
22
P2
14

SECOND DIRECTION
400
Py FACE
18 16
26b
16 18 16
26a
1618
FIRST DIRECTION
p
p

SECOND DIRECTION
400
Px FACE
18 16
16 18 16
1618
FIRST DIRECTION
24e
$n^-$
$n^-$
24c
24d
n
n
24b
H
H'
G
G'

SILICON CARBIDE BASED A METAL-OXIDE-SEMICONDUCTOR FIELD-EFFECT TRANSISTOR (MOSFET) INCLUDING DRIFT REGION WITH STACK OF N-TYPE AN P-TYPE IMPURITY REGIONS

CROSS-REFERENCE TO RELATED APPLICATION

This application is based upon and claims the benefit of priority from Japanese Patent Application No. 2023-043639, filed on Mar. 17, 2023, the entire contents of which are incorporated herein by reference.

FIELD

Embodiments described herein relate generally to a semiconductor device.

BACKGROUND

Silicon carbide is a material for a semiconductor device. Silicon carbide is a material for semiconductor devices. Compared to silicon, silicon carbide has excellent physical properties: with a band gap about three times greater, a breakdown field strength about ten times greater, and a thermal conductivity about three times greater. By utilizing these characteristics, it is possible to achieve, for example, a metal-oxide-semiconductor field-effect transistor (MOSFET) capable of operating at a high breakdown voltage, a low loss, and a high temperature.

For improving the performance of the MOSFET using silicon carbide, it is desirable to reduce the product (Ron× Qoss) of on-resistance and an output charge amount, which is one of performance indexes. The output charge amount (Qoss) is the amount of charge required for charging a capacitance between the drain and the source of the MOSFET.

DETAILED DESCRIPTION

Figure 1A:
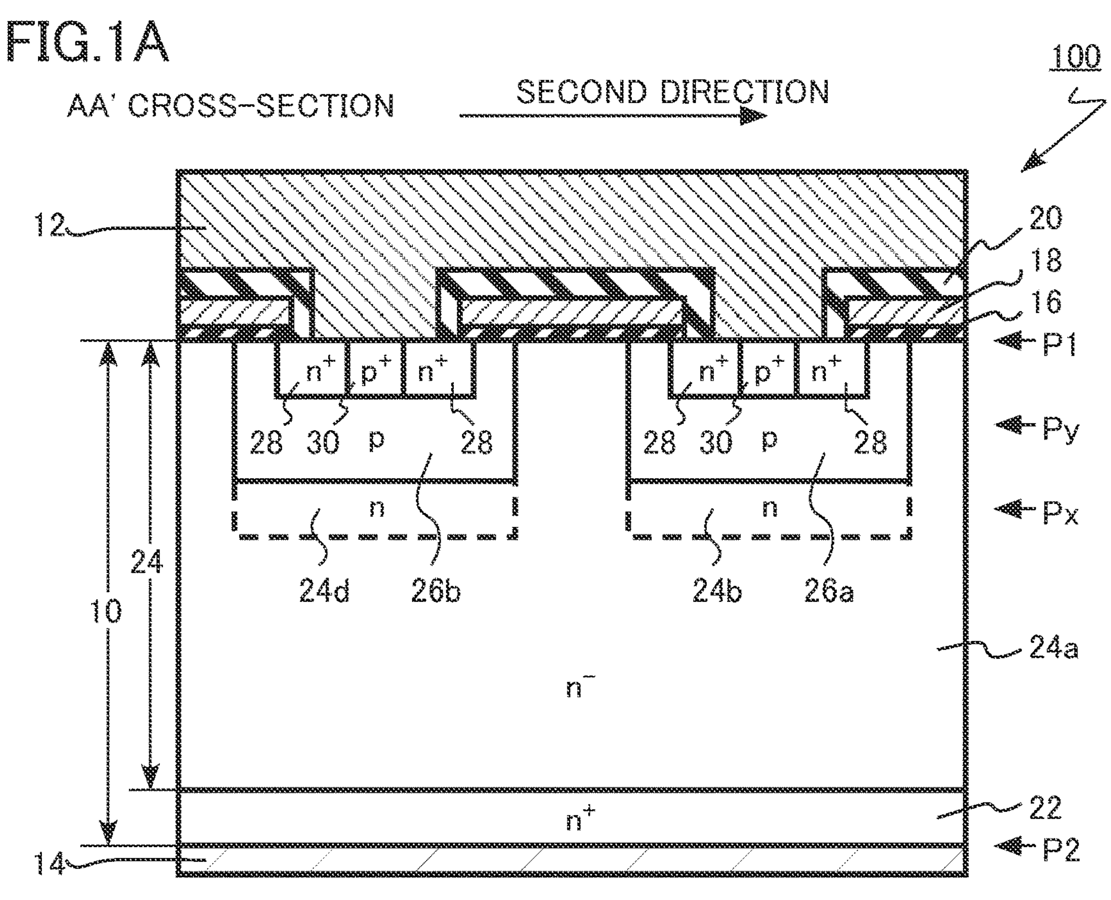
FIGS. 1A and 1B are schematic sectional views of a semiconductor device according to a first embodiment.

A semiconductor device according to an embodiment includes: a silicon carbide layer having a first face and a second face facing the first face; a first electrode provided on a side of the first face of the silicon carbide layer; a second electrode provided on a side of the second face of the silicon carbide layer; a first silicon carbide region of a first conductivity type provided in the silicon carbide layer; a second silicon carbide region of a second conductivity type provided in the silicon carbide layer and provided between the first silicon carbide region and the first face; a third silicon carbide region of the first conductivity type provided in the silicon carbide layer and provided between the second silicon carbide region and the first face, the third silicon carbide region being in contact with the first electrode; a gate electrode provided on the first face side of the silicon carbide layer and facing the second silicon carbide region; and a gate insulating layer provided between the gate electrode and the second silicon carbide region. The first silicon carbide region includes a first region, a plurality of second regions provided between the first region and the second silicon carbide region and in contact with the second silicon carbide region, and a plurality of third regions provided between the first region and the second silicon carbide region and in contact with the second silicon carbide region. The second regions and the third regions are alternately provided in a first direction parallel to the first face. A first conductivity type impurity concentration in each of the second regions is higher than a first conductivity type impurity concentration in the first region and a first conductivity type impurity concentration in each of the third regions.

Embodiments of the present disclosure will be described below with reference to the drawings. In the following description, the same or similar members or the like are denoted by the same reference numeral, and the description of the member or the like once described may be omitted as appropriate.

Further, in the following description, notations $n^+$, n, and $n^-$ and $p^+$, p, and p-represent relative levels of impurity concentration in each conductivity type. That is, $n^+$ indicates a relatively higher concentration of n-type impurities than n, and $n^-$ indicates a relatively lower concentration of n-type impurities than n. In addition, $p^+$ indicates a relatively higher concentration of p-type impurities than p, and $p^-$ indicates a relatively lower concentration of p-type impurities than p.

Note that $n^+$ type and $n^-$ type may be simply referred to as n-type, $p^+$ type, and $p^-$ type may be simply referred to as p-type. The impurity concentration can be measured by, for example, secondary-ion mass spectrometry (SIMS). The relative level of the impurity concentration can also be determined from the level of the carrier concentration obtained by, for example, scanning capacitance microscopy (SCM). In addition, the depth, thickness, and other distances of the impurity region can be obtained by, for example, SIMS. Also, the depth, thickness, width, spacing, and other distances of the impurity region can be obtained from, for example, a composite image of an SCM image and an atomic force microscope (AFM) image.

First Embodiment

A semiconductor device according to a first embodiment includes: a silicon carbide layer having a first face and a second face facing the first face; a first electrode provided on a side of the first face of the silicon carbide layer; a second electrode provided on a side of the second face of the silicon carbide layer; a first silicon carbide region of a first conductivity type provided in the silicon carbide layer; a second silicon carbide region of a second conductivity type provided in the silicon carbide layer and provided between the first silicon carbide region and the first face; a third silicon carbide region of the first conductivity type provided in the silicon carbide layer and provided between the second silicon carbide region and the first face, the third silicon carbide region being in contact with the first electrode; a gate electrode provided on the first face side of the silicon carbide layer and facing the second silicon carbide region; and a gate insulating layer provided between the gate electrode and the second silicon carbide region. The first silicon carbide region includes a first region, a plurality of second regions provided between the first region and the second silicon carbide region and in contact with the second silicon carbide region, and a plurality of third regions provided between the first region and the second silicon carbide region and in contact with the second silicon carbide region. The second regions and the third regions are alternately provided in a predetermined direction parallel to the first face. A first conductivity type impurity concentration in each of the second regions is higher than a first conductivity type impurity concentration in the first region and a first conductivity type impurity concentration in each of the third regions.

Figure 1B:
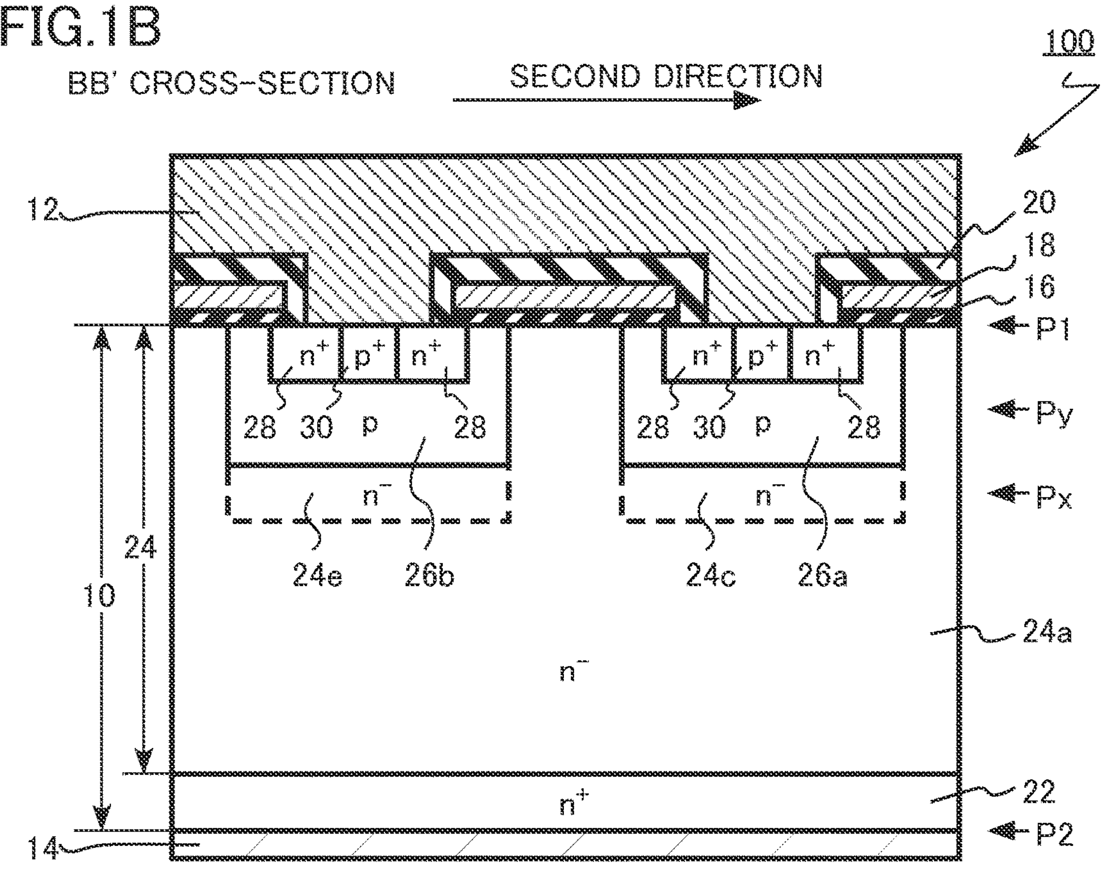
Figure 2:
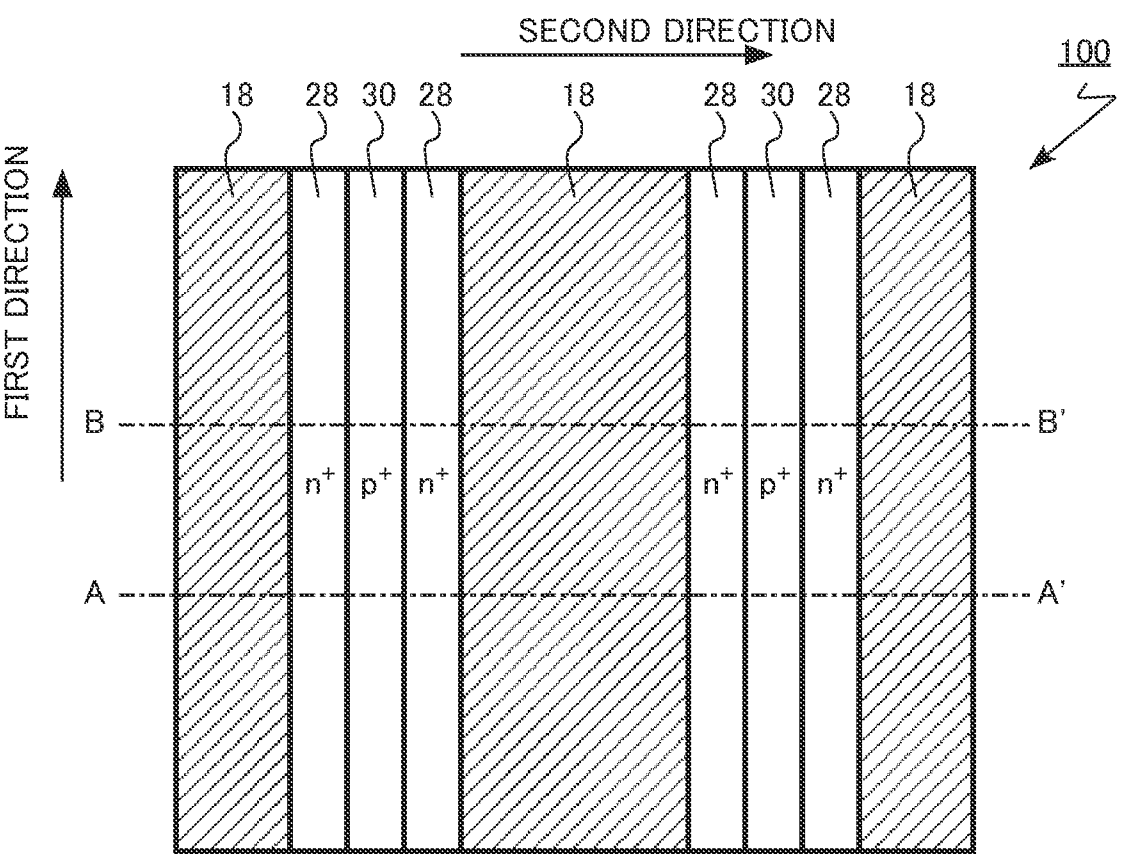
FIG. 2 is a schematic top view of the first embodiment.
Figure 3A:
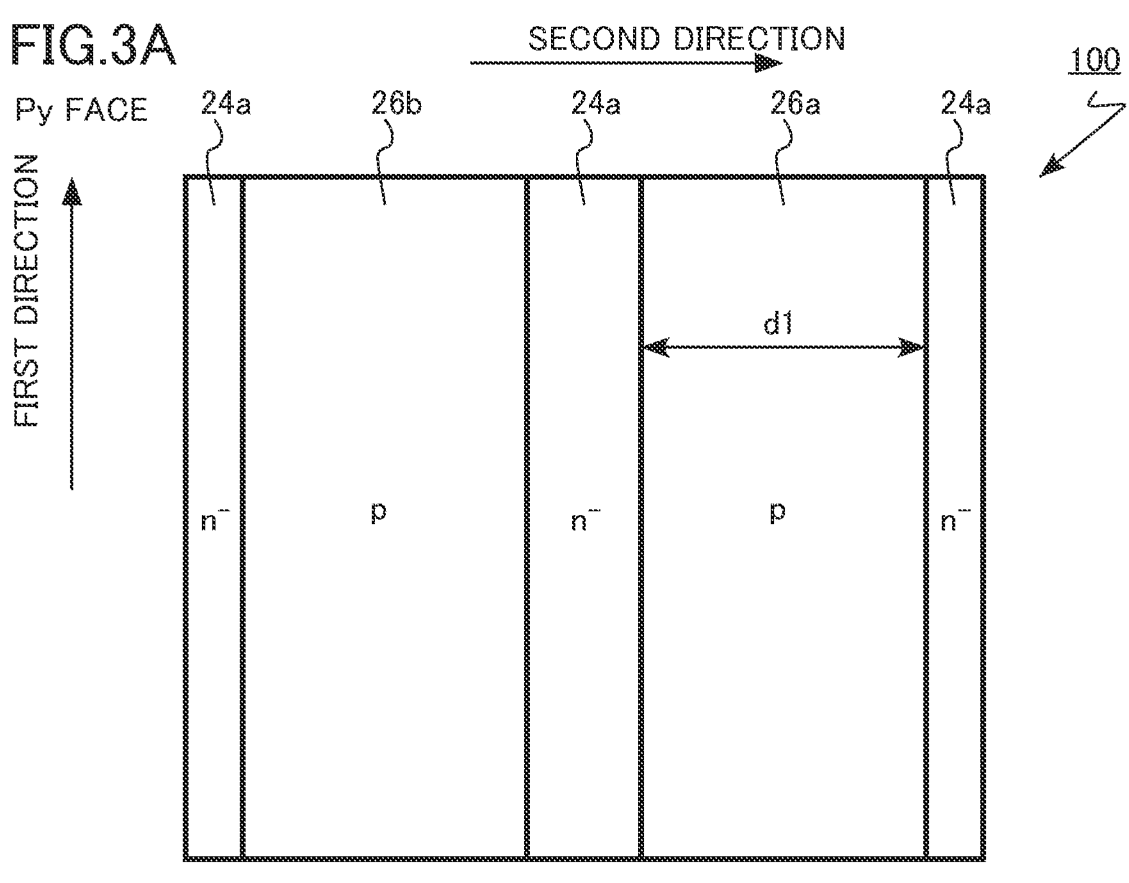
FIGS. 3A and 3B are schematic sectional views of the semiconductor device according to the first embodiment.
Figure 3B:
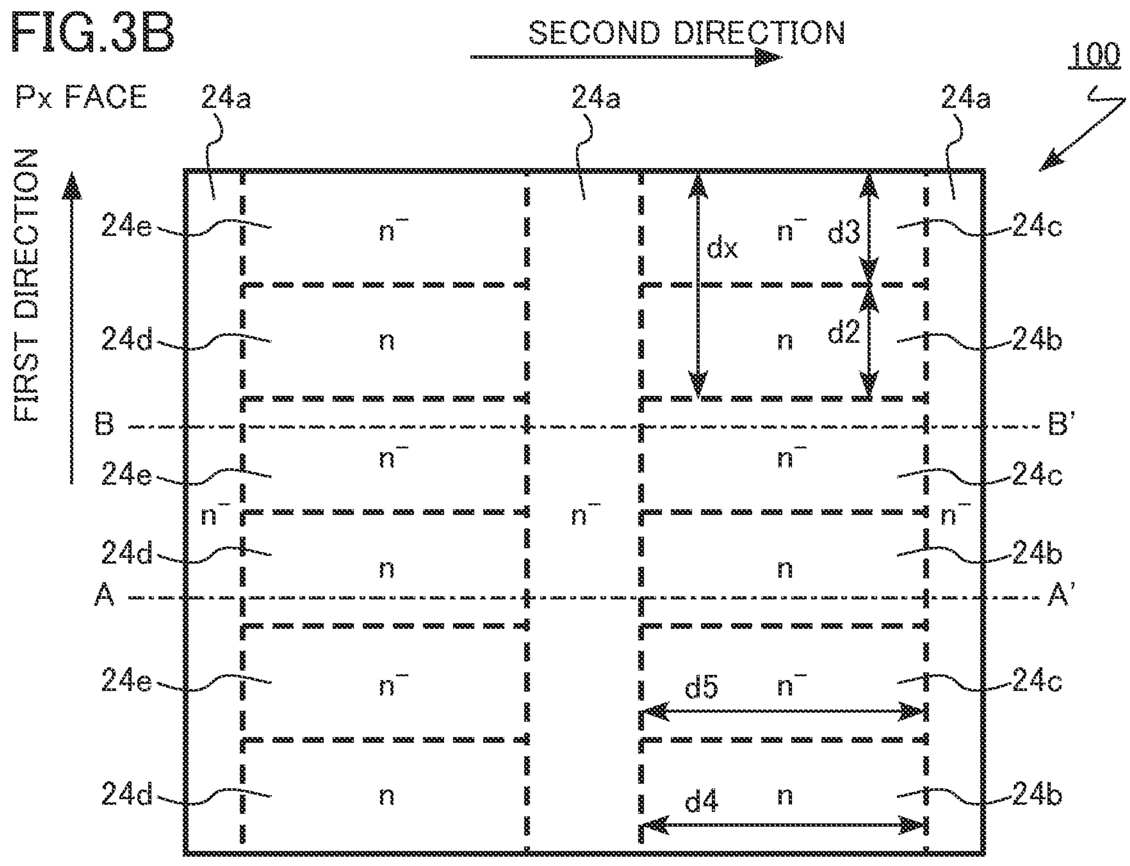

FIGS. 1A and 1B are schematic sectional views of the semiconductor device according to the first embodiment. FIG. 2 is a schematic top view of the first embodiment. FIG. 2 is a view of the pattern of the gate electrode overlaid with the pattern of the silicon carbide region on the front surface of the silicon carbide layer. FIGS. 3A and 3B are schematic sectional views of the semiconductor device according to the first embodiment.

FIG. 1A is a cross-section taken along line AA' of FIGS. 2 and 3B. FIG. 1B is a cross-section taken along line BB' of FIGS. 2 and 3B. FIG. 3A is a sectional view taken along face Py of FIGS. 1A and 1B. FIG. 3B is a sectional view taken along face Px of FIGS. 1A and 1B.

The semiconductor device according to the first embodiment is a planar-gate-type vertical MOSFET 100 using silicon carbide. The MOSFET 100 of the first embodiment is, for example, a double implantation MOSFET (DIMOSFET) in which a body region and a source region are formed by ion implantation.

A case where the first conductivity type is n-type and the second conductivity type is p-type will be described below as an example. The MOSFET 100 is a vertical n-channel MOSFET using electrons as carriers.

The MOSFET 100 includes a silicon carbide layer 10, a source electrode 12, a drain electrode 14, a gate insulating layer 16, a gate electrode 18, and an interlayer insulating layer 20. The source electrode 12 is an example of a first electrode. The drain electrode 14 is an example of a second electrode.

In the silicon carbide layer 10, an $n^+$ type drain region 22, an $n^-$ type drift region 24, a p-type first body region 26*a*, a p-type second body region 26*b*, an $n^+$ type source region 28, and a $p^+$ type body contact region 30 are provided. The drift region 24 is an example of a first silicon carbide region. The first body region 26*a* is an example of a second silicon carbide region. The second body region 26*b* is an example of a fourth silicon carbide region. The source region 28 is an example of a third silicon carbide region.

The drift region 24 includes a main region 24*a*, a first high-concentration region 24*b*, a first low-concentration region 24*c*, a second high-concentration region 24*d*, and a second low-concentration region 24*e*. The main region 24*a* is an example of a first region. The first high-concentration region 24*b* is an example of a second region. The first low-concentration region 24*c* is an example of a third region. The second high-concentration region 24*d* is an example of a fourth region. The second low-concentration region 24*e* is an example of a fifth region.

The silicon carbide layer 10 is provided between the source electrode 12 and the drain electrode 14. The silicon carbide layer 10 is provided between the gate electrode 18 and the drain electrode 14. The silicon carbide layer 10 is single crystal SiC. The silicon carbide layer 10 is, for example, 4H—SiC.

The silicon carbide layer 10 includes a first face ("P1" in FIG. 1) and a second face ("P2" in FIG. 1). In the following, the first face may be referred to as a front surface, and the second face may be referred to as a back surface. Note that the "depth" hereinafter means a depth with the first face as a reference.

The first face P1 is, for example, a face inclined at 0 degrees or more and 8 degrees or less with respect to the (0001) face. The second face P2 is, for example, a face inclined at an angle of 0 degrees or more and 8 degrees or less with respect to the (000-1) face. The (0001) face is called a silicon face. The (000-1) face is called a carbon face.

The $n^+$ type drain region 22 is provided on the back surface side of the silicon carbide layer 10. The drain region 22 contains, for example, nitrogen (N) as n-type impurities. The n-type impurity concentration in the drain region 22 is, for example, $1\times10^{18}$ $cm^{-3}$ or more and $1\times10^{21}$ $cm^{-3}$ or less.

The $n^-$ type drift region 24 is provided between the drain region 22 and the first face P1. The drift region 24 is provided between the source electrode 12 and the drain electrode 14. The drift region 24 is provided between the gate electrode 18 and the drain electrode 14.

The drift region 24 is provided on the drain region 22. The drift region 24 is, for example, a region formed on the drain region 22 using an epitaxial growth method.

The drift region 24 contains, for example, nitrogen (N) as n-type impurities. The n-type impurity concentration in the drift region 24 is lower than the n-type impurity concentration in the drain region 22. The n-type impurity concentration in the drift region 24 is, for example, $4\times10^{14}$ $cm^{-3}$ or more and $1\times10^{18}$ $cm^{-3}$ or less. The thickness of the drift region 24 is, for example, 5 μm or more and 150 μm or less.

The p-type first body region 26*a* and second body region 26*b* are provided between the drift region 24 and the first face P1. The first body region 26*a* and the second body region 26*b* are separated from each other.

The first body region 26*a* and the second body region 26*b* extend in a first direction parallel to the first face P1. The second body region 26*b* is provided in a second direction parallel to the first face P1 and orthogonal to the first direction with respect to the first body region 26*a*.

The first body region 26*a* and the second body region 26*b* function as the channel regions of the MOSFET 100.

The first body region 26*a* and the second body region 26*b* contain, for example, aluminum (Al) as p-type impurities. The p-type impurity concentration in the first body region 26*a* and the second body region 26*b* is, for example, $1\times10^{17}$ $cm^{-3}$ or more and $1\times10^{18}$ $cm^{-3}$ or less.

The depths of the first body region 26*a* and the second body region 26*b* are, for example, 0.3 μm or more and 1.5 μm or less.

The first body region 26*a* and the second body region 26*b* are fixed to the electric potential of the source electrode 12.

The $n^+$ type source region 28 is provided between the first body region 26*a* and the first face P1. The $n^+$ type source region 28 is provided between the second body region 26*b* and the first face P1.

The source region 28 contains, for example, phosphorus (P) as n-type impurities. The n-type impurity concentration in the source region 28 is higher than the n-type impurity concentration in the drift region 24.

The n-type impurity concentration in the source region 28 is, for example, $1\times10^{19}$ $cm^{-3}$ or more and $1\times10^{21}$ $cm^{-3}$ or less. The depth of the source region 28 is shallower than the depths of the first body region 26*a* and the second body region 26*b*, and is, for example, 0.1 μm or more and 0.5 μm or less.

The source region 28 is in contact with the source electrode 12. The junction between the source region 28 and the source electrode 12 is, for example, an ohmic junction.

The source region 28 is fixed to the electric potential of the source electrode 12.

The $p^+$ type body contact region 30 is provided between the first body region 26*a* and the first face P1. The $p^+$ type body contact region 30 is provided between the second body region 26*b* and the first face P1.

The p-type impurity concentration in the body contact region 30 is higher than the p-type impurity concentration in the first body region 26*a* and the second body region 26*b*.

The body contact region 30 contains, for example, aluminum (Al) as p-type impurities. The p-type impurity concentration in the body contact region 30 is, for example, $5\times10^{19}$ $cm^{-3}$ or more and $1\times10^{21}$ $cm^{-3}$ or less.

The depth of the body contact region 30 is, for example, 0.3 μm or more and 0.6 μm or less.

The body contact region 30 is in contact with the source electrode 12.

The gate electrode 18 is provided on the first face P1 side of the silicon carbide layer 10. As illustrated in FIG. 2, the gate electrode 18 extends in the first direction parallel to the first face P1. A plurality of gate electrodes 18 are disposed in parallel to each other in the second direction parallel to the first face P1 and orthogonal to the first direction. The gate electrode 18 has a stripe pattern on the first face P1.

The gate electrode 18 is a conductive layer. The gate electrode 18 is, for example, polycrystalline silicon containing p-type impurities or n-type impurities.

The gate electrode 18 faces, for example, a portion of the first body region 26*a* in contact with the first face P1. The gate electrode 18 faces, for example, a portion of the second body region 26*b* in contact with the first face P1.

The gate insulating layer 16 is provided between the gate electrode 18 and the first body region 26*a*, and is provided between the gate electrode 18 and the second body region 26*b*. The gate insulating layer 16 is provided between the gate electrode 18 and the drift region 24.

The gate insulating layer 16 is, for example, silicon oxide. For example, a high-k insulating material (high dielectric constant insulating material) can be applied to the gate insulating layer 16.

The interlayer insulating layer 20 is provided on the gate electrode 18 and the silicon carbide layer 10. The interlayer insulating layer 20 is, for example, silicon oxide.

The source electrode 12 is in contact with the source region 28. The source electrode 12 is in contact with the body contact region 30.

The source electrode 12 contains metal. The metal forming the source electrode 12 is, for example, a stacked structure of titanium (Ti) and aluminum (Al). A portion of the source electrode 12 in contact with the source region is, for example, metal silicide. The metal silicide is, for example, titanium silicide or nickel silicide.

The drain electrode 14 is provided on the back surface of the silicon carbide layer 10. The drain electrode 14 is in contact with the drain region 22.

The drain electrode 14 is, for example, metal or a metal-semiconductor compound. The drain electrode 14 contains, for example, at least one material selected from the group consisting of nickel silicide, titanium (Ti), nickel (Ni), silver (Ag), and gold (Au).

The drift region 24 includes an n-type main region 24*a*, a plurality of n-type first high-concentration regions 24*b*, a plurality of n-type first low-concentration regions 24*c*, a plurality of n-type second high-concentration regions 24*d*, and a plurality of n-type second low-concentration regions 24*e*.

The main region 24*a* contains, for example, nitrogen (N) as n-type impurities. The n-type impurity concentration in the main region 24*a* is, for example, $4\times10^{14}$ $cm^{-3}$ or more and $1\times10^{17}$ $cm^{-3}$ or less.

The plurality of first high-concentration regions 24*b* are provided between the main region 24*a* and the first body region 26*a*. The plurality of first high-concentration regions 24*b* are in contact with the first body region 26*a*. The plurality of first high-concentration regions 24*b* is in contact with, for example, the main region 24*a*.

The plurality of first low-concentration regions 24*c* are provided between the main region 24*a* and the first body region 26*a*. The plurality of first low-concentration regions 24*c* are in contact with the first body region 26*a*. The plurality of first low-concentration regions 24*c* is in contact with, for example, the main region 24*a*.

As illustrated in FIG. 3A, the first body region 26*a* extends in the first direction. As illustrated in FIG. 3B, the first high-concentration regions 24*b* and the first low-concentration regions 24*c* are alternately provided in the first direction. One first low-concentration region 24*c* is sandwiched between two first high-concentration regions 24*b* in the first direction. The first high-concentration region 24*b* and the first low-concentration region 24*c* are in contact with each other.

The first high-concentration region 24*b* contains, for example, nitrogen (N) as n-type impurities. The n-type impurity concentration in the first high-concentration region 24*b* is higher than the n-type impurity concentration in the main region 24*a*. The n-type impurity concentration in the first high-concentration region 24*b* is higher than the n-type impurity concentration in the first low-concentration region 24*c*.

The n-type impurity concentration in the first high-concentration region 24*b* is, for example, $5\times10^{16}$ $cm^{-3}$ or more and $1\times10^{18}$ $cm^{-3}$ or less.

The first low-concentration region 24*c* contains, for example, nitrogen (N) as n-type impurities. The n-type impurity concentration in the first low-concentration region 24*c* is equal to or higher than the n-type impurity concentration in the main region 24*a*. The n-type impurity concentration in the first low-concentration region 24*c* is higher than the n-type impurity concentration in the main region 24*a*, for example.

The n-type impurity concentration in the first low-concentration region 24*c* is, for example, $4\times10^{14}$ $cm^{-3}$ or more and $1\times10^{17}$ $cm^{-3}$ or less.

The length (d2 in FIG. 3B) of the first high-concentration region 24*b* in the first direction is equal to, for example, the length (d3 in FIG. 3B) of the first low-concentration region 24*c* in the first direction.

The sum of the length d2 of the first high-concentration region 24*b* in the first direction and the length d3 of the first low-concentration region 24*c* in the first direction is, for example, 0.5 times or more and 2 times or less the length (d1 in FIG. 3A) of the first body region 26*a* in the second direction. In other words, the repetition pitch (dx in FIG. 3B) between the first high-concentration region 24*b* and the first low-concentration region 24*c* is, for example, 0.5 times or more and 2 times or less the length d1 of the first body region 26*a* in the second direction.

The length (d4 in FIG. 3B) of the first high-concentration region 24*b* in the second direction is, for example, 0.8 times or more and 1.2 times or less the length (d1 in FIG. 3A) of the first body region 26*a* in the second direction.

The length (d5 in FIG. 3B) of the first low-concentration region 24*c* in the second direction is, for example, 0.8 times or more and 1.2 times or less the length (d1 in FIG. 3A) of the first body region 26*a* in the second direction.

The thickness of the first high-concentration region 24*b* between the first body region 26*a* and the main region 24*a* in the direction from the first face P1 toward the second face P2 is, for example, 0.1 μm or more and 1 μm or less. The thickness of the first low-concentration region 24*c* between the first body region 26*a* and the main region 24*a* in the direction from the first face P1 toward the second face P2 is, for example, 0.1 μm or more and 1 μm or less.

The plurality of second high-concentration regions 24*d* are provided between the main region 24*a* and the second body region 26*b*. The plurality of second high-concentration regions 24*d* are in contact with the second body region 26*b*. The plurality of second high-concentration regions 24*d* are in contact with, for example, the main region 24*a*.

The plurality of second low-concentration regions 24*e* are provided between the main region 24*a* and the second body region 26*b*. The plurality of second low-concentration regions 24*e* are in contact with the second body region 26*b*. The plurality of second low-concentration regions 24*e* are in contact with, for example, the main region 24*a*.

As illustrated in FIG. 3A, the second body region 26*b* extends in the first direction. As illustrated in FIG. 3B, the second high-concentration regions 24*d* and the second low-concentration regions 24*e* are alternately provided in the first direction. One second low-concentration region 24*e* is sandwiched between two second high-concentration regions 24*d* in the first direction. The second high-concentration region 24*d* and the second low-concentration region 24*e* are in contact with each other.

As illustrated in FIG. 3B, the first high-concentration region 24*b* is provided in the second direction of the second high-concentration region 24*d*. The first low-concentration region 24*c* is provided in the second direction of the second low-concentration region 24*e*.

The second high-concentration region 24*d* contains, for example, nitrogen (N) as n-type impurities. The n-type impurity concentration in the second high-concentration region 24*d* is higher than the n-type impurity concentration in the main region 24*a*. The n-type impurity concentration in the second high-concentration region 24*d* is higher than the n-type impurity concentration in the second low-concentration region 24*e*. The n-type impurity concentration in the second high-concentration region 24*d* is equal to the n-type impurity concentration in the first high-concentration region 24*b*, for example.

The n-type impurity concentration in the second high-concentration region 24*d* is, for example, $5\times10^{16}$ $cm^{-3}$ or more and $1\times10^{18}$ $cm^{-3}$ or less.

The second low-concentration region 24*e* contains, for example, nitrogen (N) as n-type impurities. The n-type impurity concentration in the second low-concentration region 24*e* is equal to or higher than the n-type impurity concentration in the main region 24*a*. The n-type impurity concentration in the second low-concentration region 24*e* is higher than the n-type impurity concentration in the main region 24*a*, for example. The n-type impurity concentration in the second low-concentration region 24*e* is equal to the n-type impurity concentration in the first low-concentration region 24*c*, for example.

The n-type impurity concentration in the second low-concentration region 24*e* is, for example, $4\times10^{14}$ $cm^{-3}$ or more and $1\times10^{17}$ $cm^{-3}$ or less.

The length of the second high-concentration region 24*d* in the first direction is equal to the length of the second low-concentration region 24*e* in the first direction, for example.

The sum of the length of the second high-concentration region 24*d* in the first direction and the length of the second low-concentration region 24*e* in the first direction is, for example, 0.5 times or more and 2 times or less the length of the second body region 26*b* in the second direction. In other words, the repetition pitch of the second high-concentration region 24*d* and the second low-concentration region 24*e* is, for example, 0.5 times or more and 2 times or less the length d1 of the second body region 26*b* in the second direction.

The length of the second high-concentration region 24*d* in the second direction is, for example, 0.8 times or more and 1.2 times or less the length of the second body region 26*b* in the second direction.

The length of the second low-concentration region 24*e* in the second direction is, for example, 0.8 times or more and 1.2 times or less the length of the second body region 26*b* in the second direction.

The thickness of the second high-concentration region 24*d* between the second body region 26*b* and the main region 24*a* in the direction from the first face P1 toward the second face P2 ranges, for example, from 0.1 μm or more and 1 μm or less. The thickness of the second low-concentration region 24*e* between the second body region 26*b* and the main region 24*a* in the direction from the first face P1 toward the second face P2 is, for example, 0.1 μm or more and 1 μm or less.

Next, the functions and effects of the MOSFET 100 of the first embodiment will be described.

For improving the performance of the MOSFET using silicon carbide, it is desirable to reduce the product (Ron×Qoss) of on-resistance and an output charge amount, which is one of performance indexes. The output charge amount (Qoss) is the amount of charge required for charging a capacitance between the drain and the source of the MOSFET.

Figures 4A, 4B:
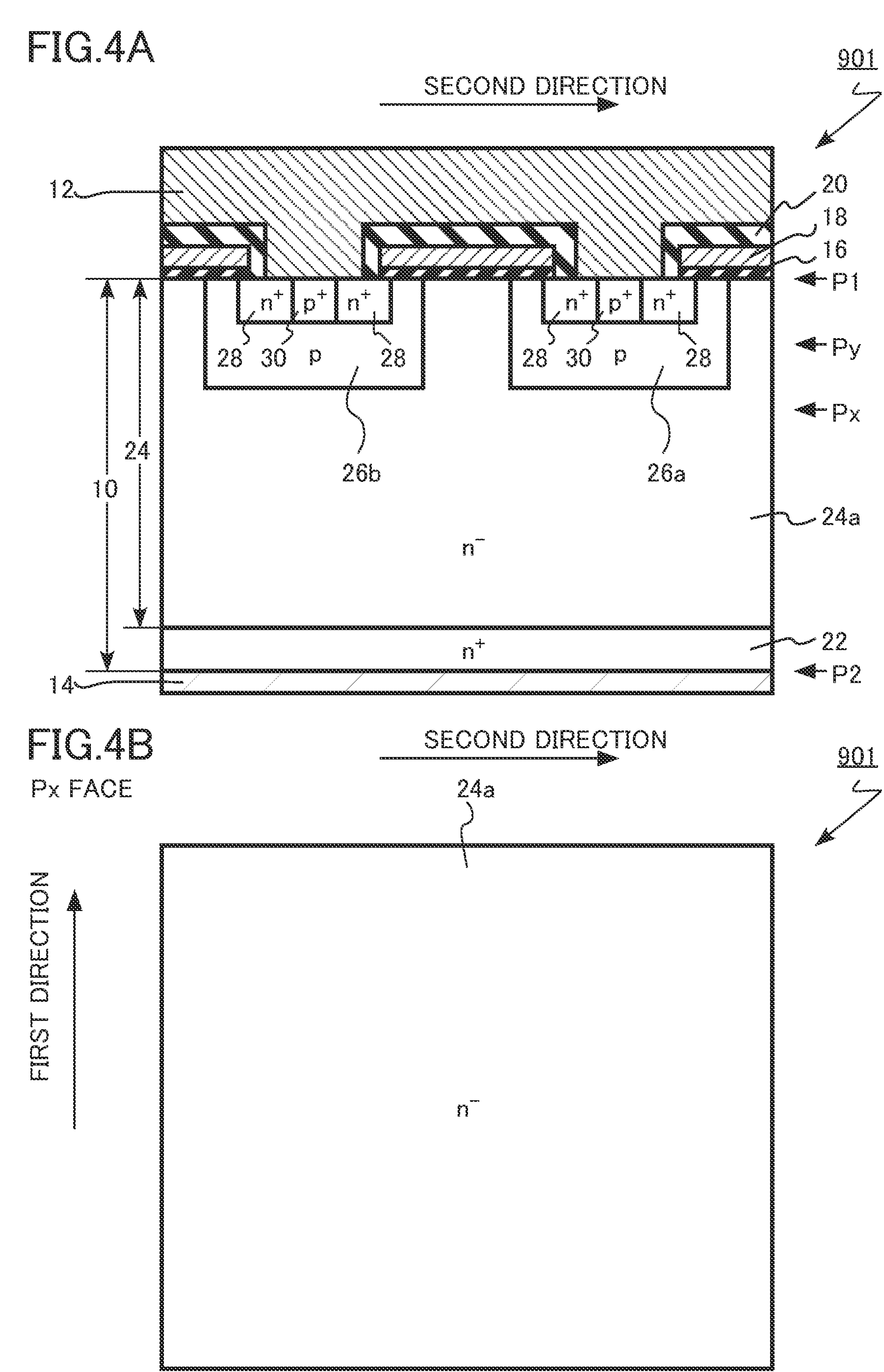
FIGS. 4A and 4B are schematic sectional views of a semiconductor device according to a first comparative example.

FIGS. 4A and 4B are schematic sectional views of a semiconductor device according to a first comparative example. FIG. 4B is a sectional view taken along face Px of FIG. 4A. FIG. 4A is a diagram corresponding to FIG. 1A of the first embodiment. FIG. 4B is a diagram corresponding to FIG. 3B of the first embodiment.

The semiconductor device according to the first comparative example is a planar-gate-type vertical MOSFET 901 using silicon carbide. The MOSFET 901 of the first comparative example is a DIMOSFET.

The MOSFET 901 of the first comparative example is different from the MOSFET 100 of the first embodiment in that the drift region 24 does not include the first high-concentration region 24*b*, the first low-concentration region 24*c*, the second high-concentration region 24*d*, or the second low-concentration region 24*e*.

Figure 5:
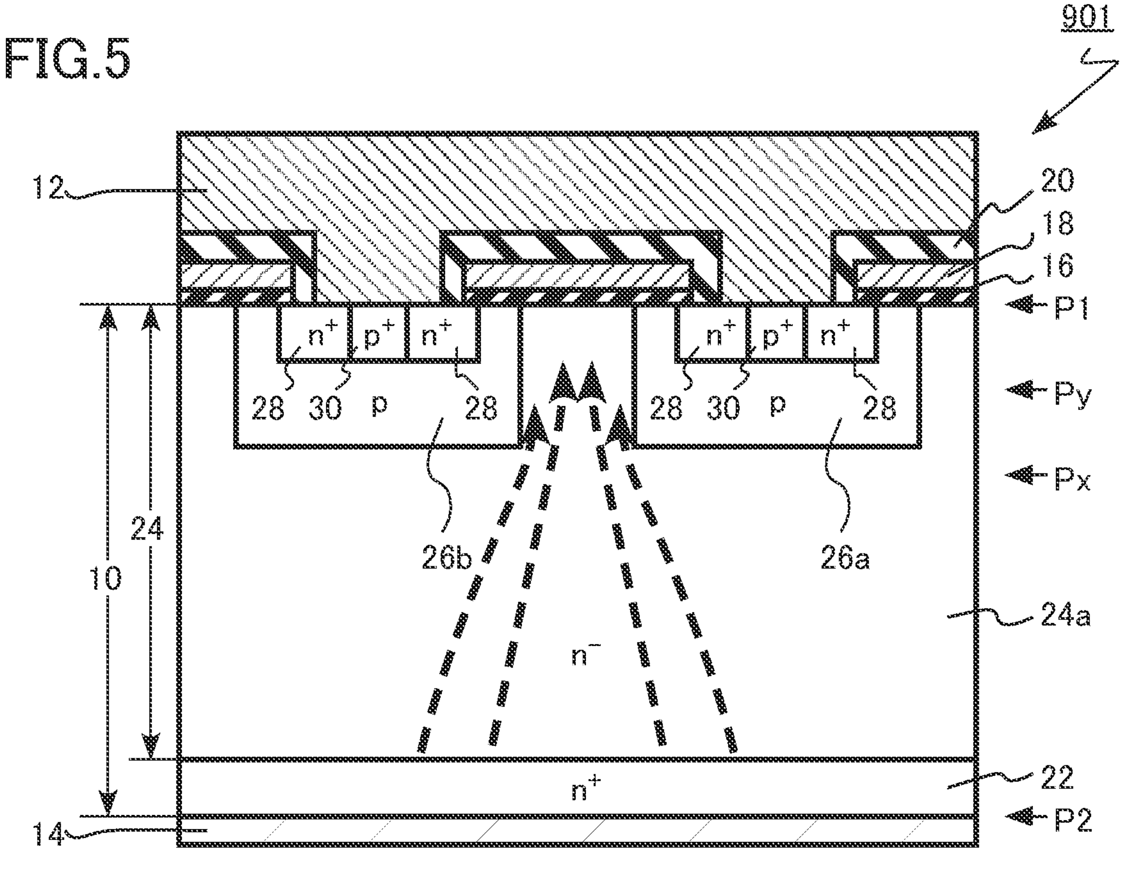
FIG. 5 is an explanatory diagram of functions and effects of the semiconductor device according to the first embodiment.

FIG. 5 is an explanatory diagram of functions and effects of the semiconductor device according to the first embodiment. FIG. 5 is a schematic sectional view of the MOSFET 901 of the first comparative example. FIG. 5 is a cross-section corresponding to the cross-section of FIG. 4A.

FIG. 5 is a diagram illustrating a path of an on-current flowing through the MOSFET 901 of the first comparative example. In the MOSFET 901 of the first comparative example, the on-current is concentrated immediately below the gate electrode 18, and the on-current is less likely to spread immediately below the first body region 26*a* and the second body region 26*b*. Therefore, it is difficult to reduce the on-resistance of the MOSFET 901.

Figures 6A, 6B:
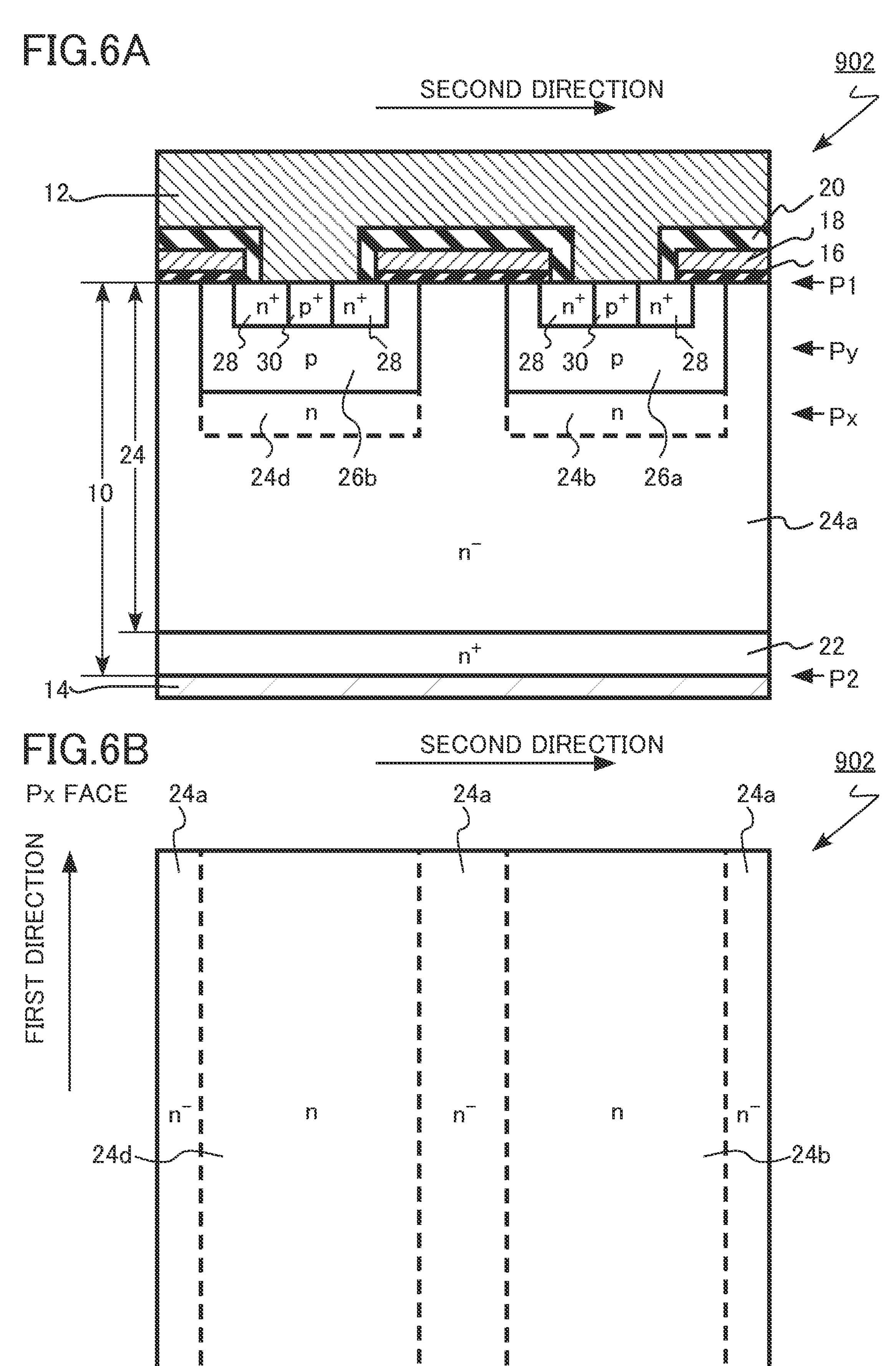
FIGS. 6A and 6B are schematic sectional views of a semiconductor device according to a second comparative example.

FIGS. 6A and 6B are schematic sectional views of a semiconductor device according to a second comparative example. FIG. 6B is a sectional view taken along face Px of FIG. 6A. FIG. 6A is a diagram corresponding to FIG. 1A of the first embodiment. FIG. 6B is a diagram corresponding to FIG. 3B of the first embodiment.

The semiconductor device according to the second comparative example is a planar-gate-type vertical MOSFET 902 using silicon carbide. The MOSFET 902 of the second comparative example is a DIMOSFET.

The MOSFET 902 of the second comparative example is different from the MOSFET 100 of the first embodiment in that the drift region 24 does not include the first low-concentration region 24*c* or the second low-concentration region 24*e*, and the first high-concentration region 24*b* and the second high-concentration region 24*d* extend in the first direction.

Figure 7:
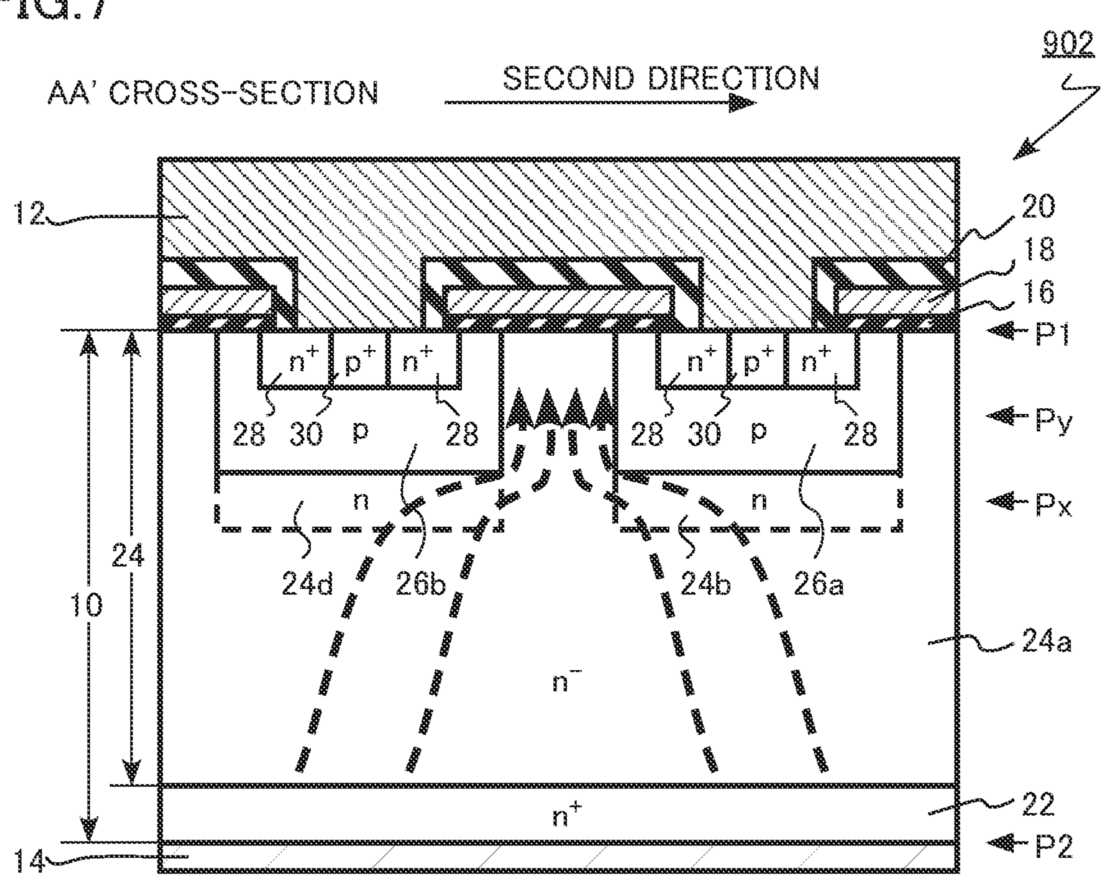
FIG. 7 is an explanatory diagram of functions and effects of the semiconductor device according to the first embodiment.

FIG. 7 is an explanatory diagram of functions and effects of the semiconductor device according to the first embodiment. FIG. 7 is a schematic sectional view of a MOSFET 902 of a second comparative example. FIG. 7 is a cross-section corresponding to the cross-section of FIG. 6A.

FIG. 7 is a diagram illustrating a path of an on-current flowing through the MOSFET 902 of the second comparative example. In the MOSFET 902 of the second comparative example, immediately below the first body region 26*a* and the second body region 26*b*, the first high-concentration region 24*b* and the second high-concentration region 24*d* with high n-type impurity concentration and low electrical resistance are provided. Thus, for example, compared to the MOSFET 901 of the first comparative example, the on-current is more likely to spread immediately below the first body region 26*a* and the second body region 26*b*. Therefore, for example, compared to the MOSFET 901 of the first comparative example, the on-resistance (Ron) of the MOSFET 902 can be reduced.

In the MOSFET 902 of the second comparative example, the first high-concentration region 24*b* and the second high-concentration region 24*d* with high n-type impurity concentration are provided immediately below the first body region 26*a* and the second body region 26*b*. Therefore, when the MOSFET 902 is turned off, a depletion layer from the first body region 26*a* and the second body region 26*b* to the drift region 24 is less likely to extend, for example, compared to the MOSFET 901 of the first comparative example.

For this reason, the MOSFET 902 of the second comparative example increases the output charge amount (Qoss), which is the amount of charge required for charging the capacitance between the drain and the source, for example, compared to the MOSFET 901 of the first comparative example. Hence the MOSFET 902 of the second comparative example reduces the on-resistance (Ron) but increases the output charge amount (Qoss) compared to the MOSFET 901 of the first comparative example. Therefore, the MOSFET 902 of the second comparative example does not necessarily reduce the product (Ron×Qoss) of the on-resistance and the output charge amount compared to the MOSFET 901 of the first comparative example.

In the MOSFET 100 of the first embodiment, the first high-concentration regions 24*b* and the first low-concentration regions 24*c* are alternately provided immediately below the first body region 26*a*. By providing the first high-concentration region 24*b* with higher n-type impurity concentration than the main region 24*a*, for example, the on-resistance (Ron) of the MOSFET 100 is reduced, for example, compared to the MOSFET 901 of the first comparative example. In addition, by providing the first low-concentration region 24*c* with lower n-type impurity concentration than the first high-concentration region 24*b*, for example, compared to the MOSFET 902 of the second comparative example, a depletion layer is more likely to extend from the first body region 26*a* to the drift region 24 when the MOSFET 100 is turned off, and an output charge amount (Qoss) is reduced.

Furthermore, the product (Ron×Qoss) of the on-resistance and the output charge amount of the MOSFET 100 is reduced, for example, compared to the MOSFET 901 of the first comparative example and the MOSFET 902 of the second comparative example. The reasons for the reduction in the product (Ron×Qoss) of the on-resistance and the output charge amount of the MOSFET 100 is considered as follows.

One reason is considered to be that even when the MOSFET is divided and provided as in the MOSFET 100 of the first embodiment, the on-current spreading promoting effect in the n-type first high-concentration region 24*b* with relatively low electric resistance immediately below the first body region 26*a* is not significantly reduced compared to the case where the MOSFET is not divided as in the MOSFET 902 of the second comparative example. Another reason is considered to be that since the first low-concentration region 24*c* with low n-type impurity concentration, which is divided and provided immediately below the first body region 26*a*, has an effect of promoting the extension of the depletion layer, the output charge amount (Qoss) does not increase greatly compared to the case where the first high-concentration region 24*b* is not provided as in the MOSFET 901 of the first comparative example.

The second high-concentration region 24*d* and the second low-concentration region 24*e* provided immediately below the second body region 26*b* also reduce the product (Ron×Qoss) of the on-resistance and the output charge amount of the MOSFET 100 by the same function as the first high-concentration region 24*b* and the first low-concentration region 24*c*.

As described above, according to the MOSFET 100 of the first embodiment, the product (Ron×Qoss) of the on-resistance and the output charge amount is reduced.

The sum (dx) of the length d2 of the first high-concentration region 24*b* in the first direction and the length d3 of the first low-concentration region 24*c* in the first direction is preferably 0.5 times or more and 2 times or less the length (d1 in FIG. 3A) of the first body region 26*a* in the second direction. Satisfying the above range leads to a further reduction in the product (Ron×Qoss) of the on-resistance and the output charge amount of the MOSFET 100.

The length (d4 in FIG. 3B) of the first high-concentration region 24*b* in the second direction is preferably 0.8 times or more and 1.2 times or less the length (d1 in FIG. 3A) of the first body region 26*a* in the second direction. Satisfying the above range leads to a further reduction in the product (Ron×Qoss) of the on-resistance and the output charge amount of the MOSFET 100.

First Modification

Figure 8A:
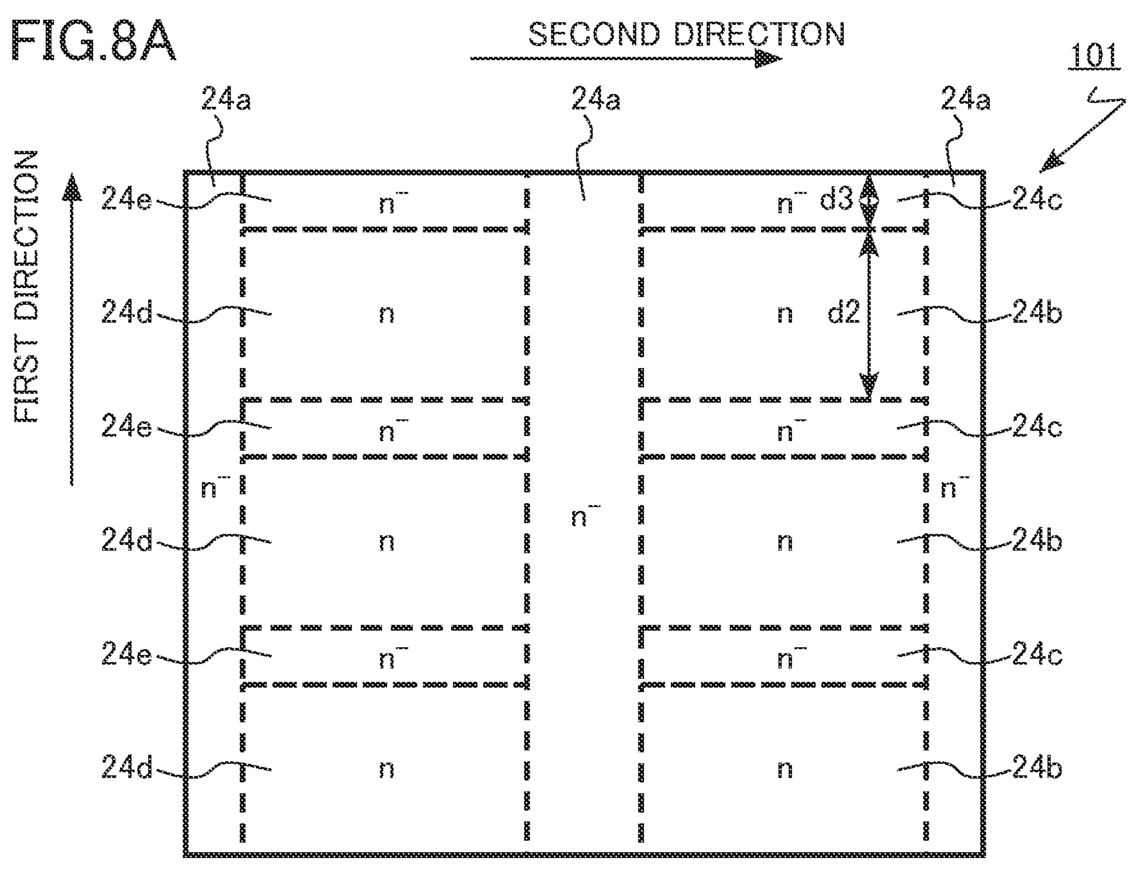
FIGS. 8A and 8B are schematic views of semiconductor devices according to a first modification and a second modification of the first embodiment.

FIG. 8A is a schematic view of a semiconductor device according to a first modification of the first embodiment. FIG. 8A is a diagram corresponding to FIG. 3B of the first embodiment.

A semiconductor device according to a first modification of the first embodiment is a MOSFET 101. The MOSFET 101 of the first modification is different from the MOSFET 100 of the first embodiment in that the length (d2 in FIG. 8A) of the first high-concentration region 24*b* in the first direction is longer than the length (d3 in FIG. 8A) of the first low-concentration region 24*c* in the first direction.

According to the MOSFET 101 of the first modification, similarly to the MOSFET 100 of the first embodiment, the product (Ron×Qoss) of the on-resistance and the output charge amount is reduced. In addition, the on-resistance is further reduced due to the length (d2 in FIG. 8A) of the first high-concentration region 24*b* in the first direction being longer than the length (d3 in FIG. 8A) of the first low-concentration region 24*c* in the first direction.

Second Modification

Figure 8B:
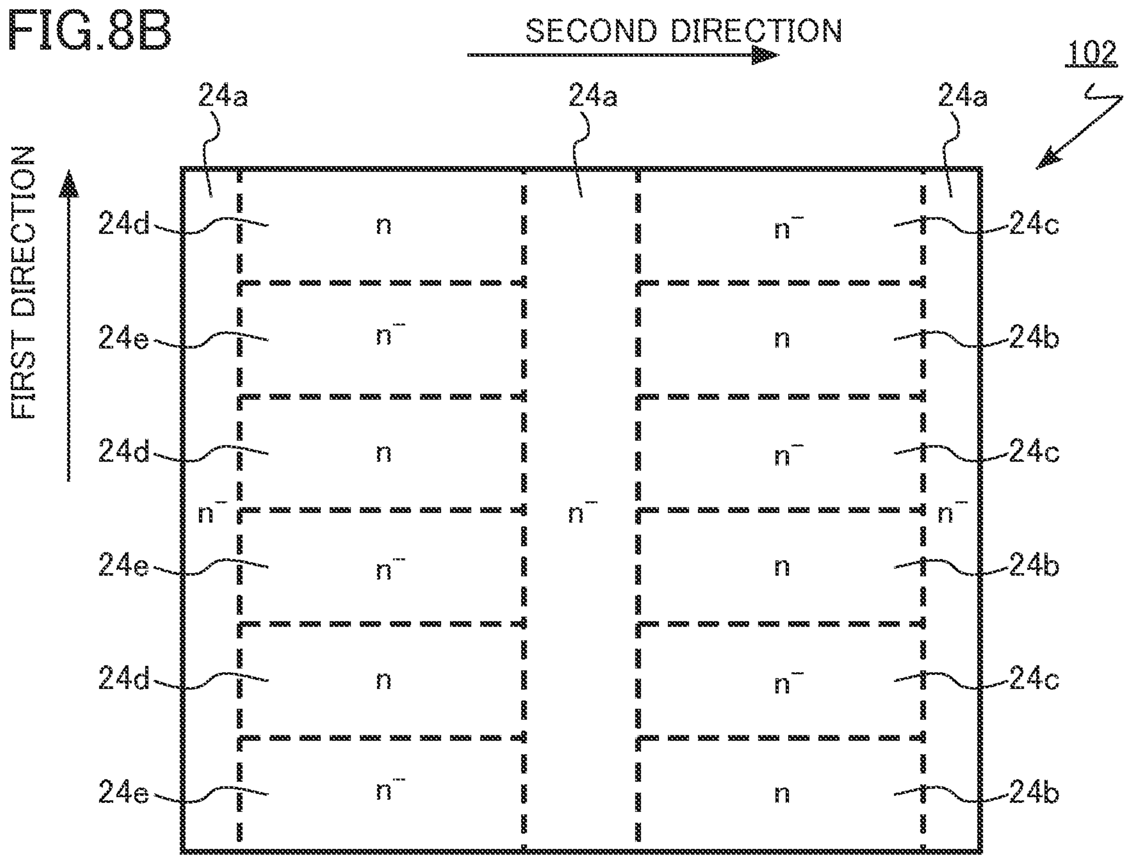

FIG. 8B is a schematic view of a semiconductor device according to a second modification of the first embodiment. FIG. 8B is a diagram corresponding to FIG. 3B of the first embodiment.

A semiconductor device according to a second modification of the first embodiment is a MOSFET 102. The MOSFET 102 of the second modification is different from the MOSFET 100 of the first embodiment in that the first high-concentration region 24*b* is provided in the second direction of the second low-concentration region 24*e*, and the first low-concentration region 24*c* is provided in the second direction of the second high-concentration region 24*d*.

According to the MOSFET 102 of the second modification, similarly to the MOSFET 100 of the first embodiment, the product (Ron×Qoss) of the on-resistance and the output charge amount is reduced. In addition, due to the first high-concentration region 24*b* being provided in the second direction of the second low-concentration region 24*e* and the first low-concentration region 24*c* being provided in the second direction of the second high-concentration region 24*d*, for example, the region where the on-current flows is homogenized in the chip. Therefore, for example, the operation characteristics of the MOSFET 102 are stabilized.

As described above, according to the first embodiment and the modified example, it is possible to achieve a semiconductor device capable of reducing the product (Ron×Qoss) of the on-resistance and the output charge amount.

Second Embodiment

A semiconductor device according to a second embodiment is different from the semiconductor device according to the first embodiment in that the first silicon carbide region has a first portion in contact with the first face and the second silicon carbide region, and the first electrode is in contact with the first portion. Hereinafter, a part of the description of contents overlapping with those of the first embodiment will be omitted.

Figure 9:
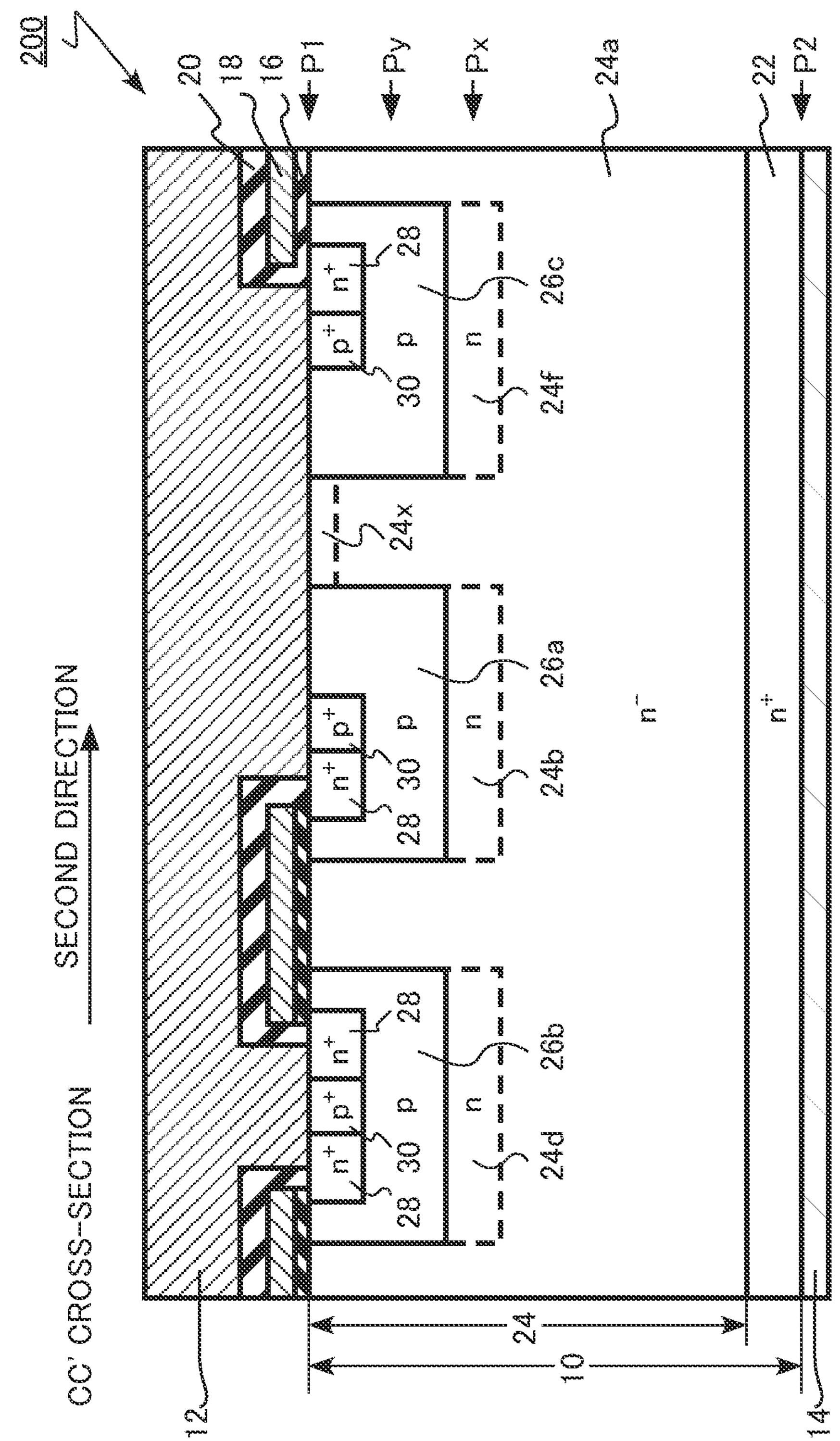
FIG. 9 is a schematic sectional view of a semiconductor device according to a second embodiment.
Figure 10:
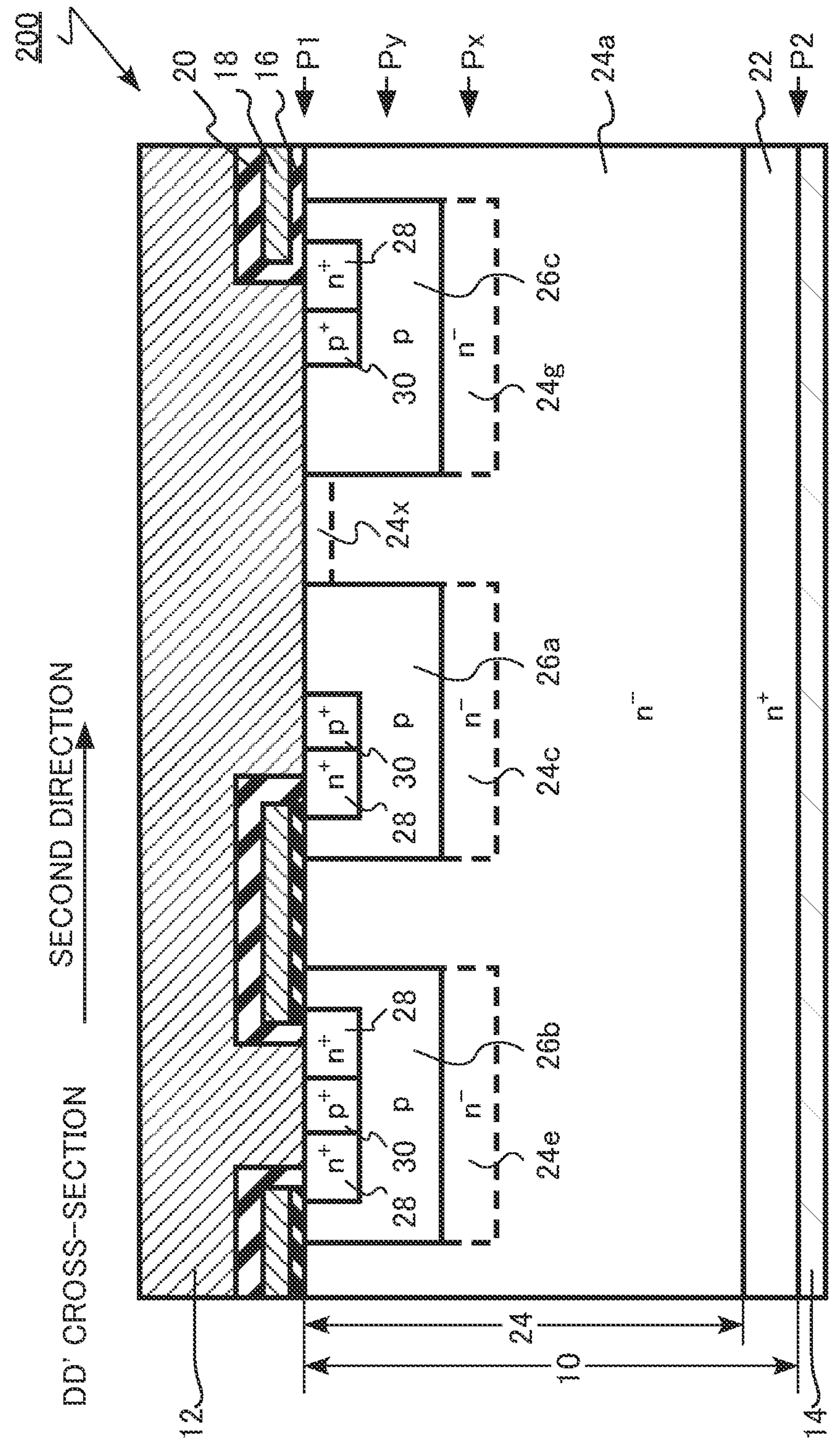
FIG. 10 is a schematic sectional view of the semiconductor device according to the second embodiment.
Figure 11:
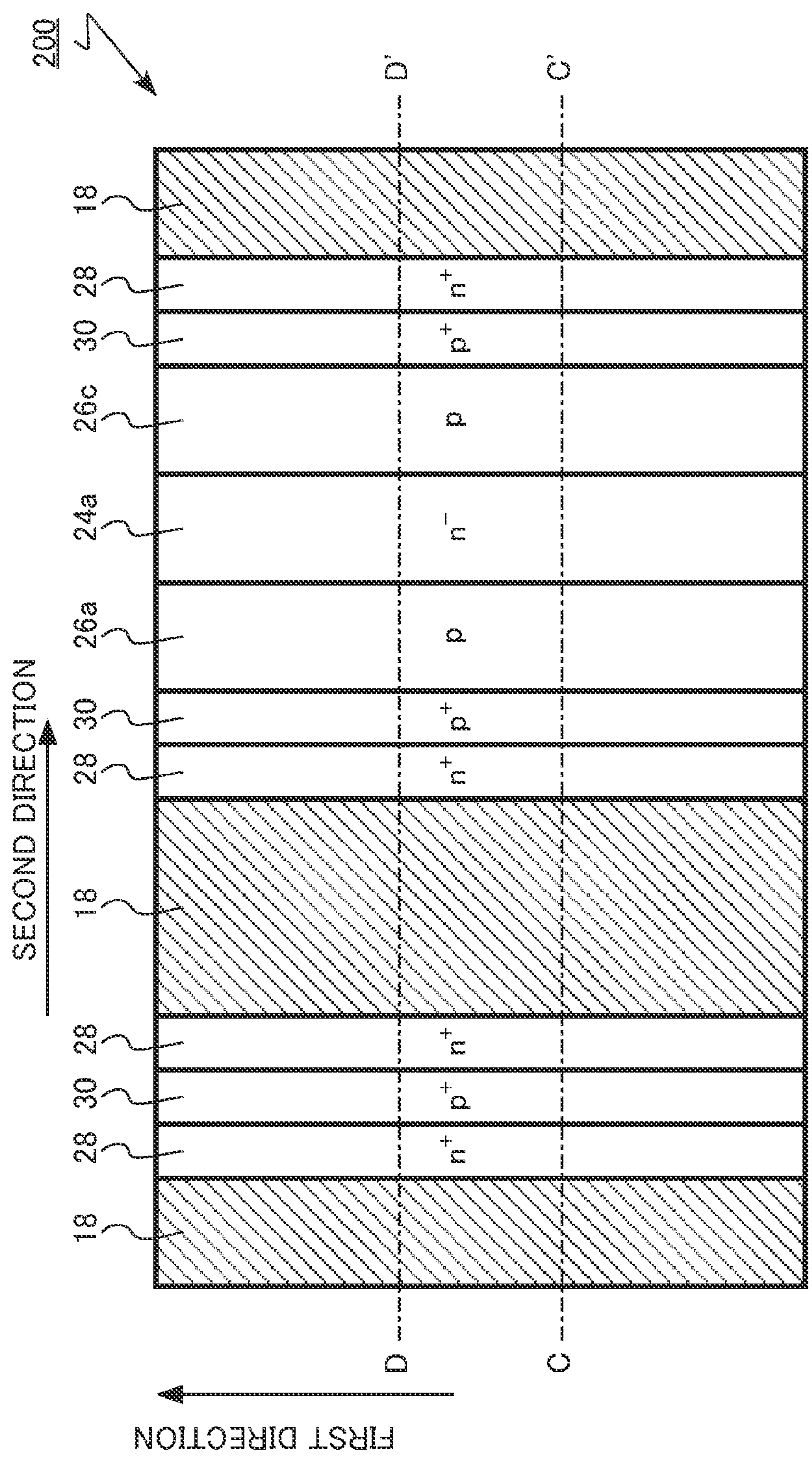
FIG. 11 is a schematic top view of the second embodiment.
Figure 12:
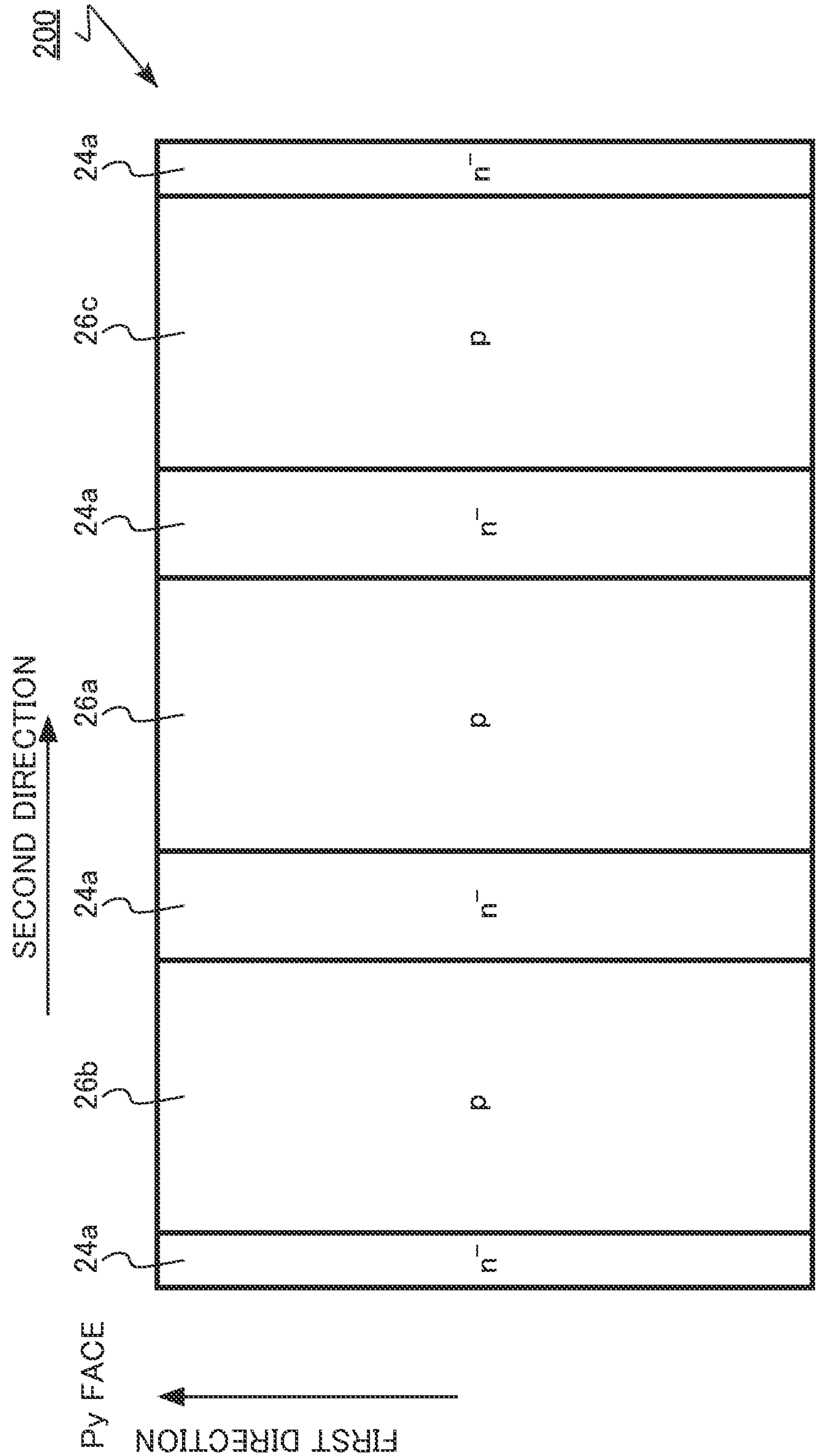
FIG. 12 is a schematic sectional view of the semiconductor device according to the second embodiment.
Figure 13:
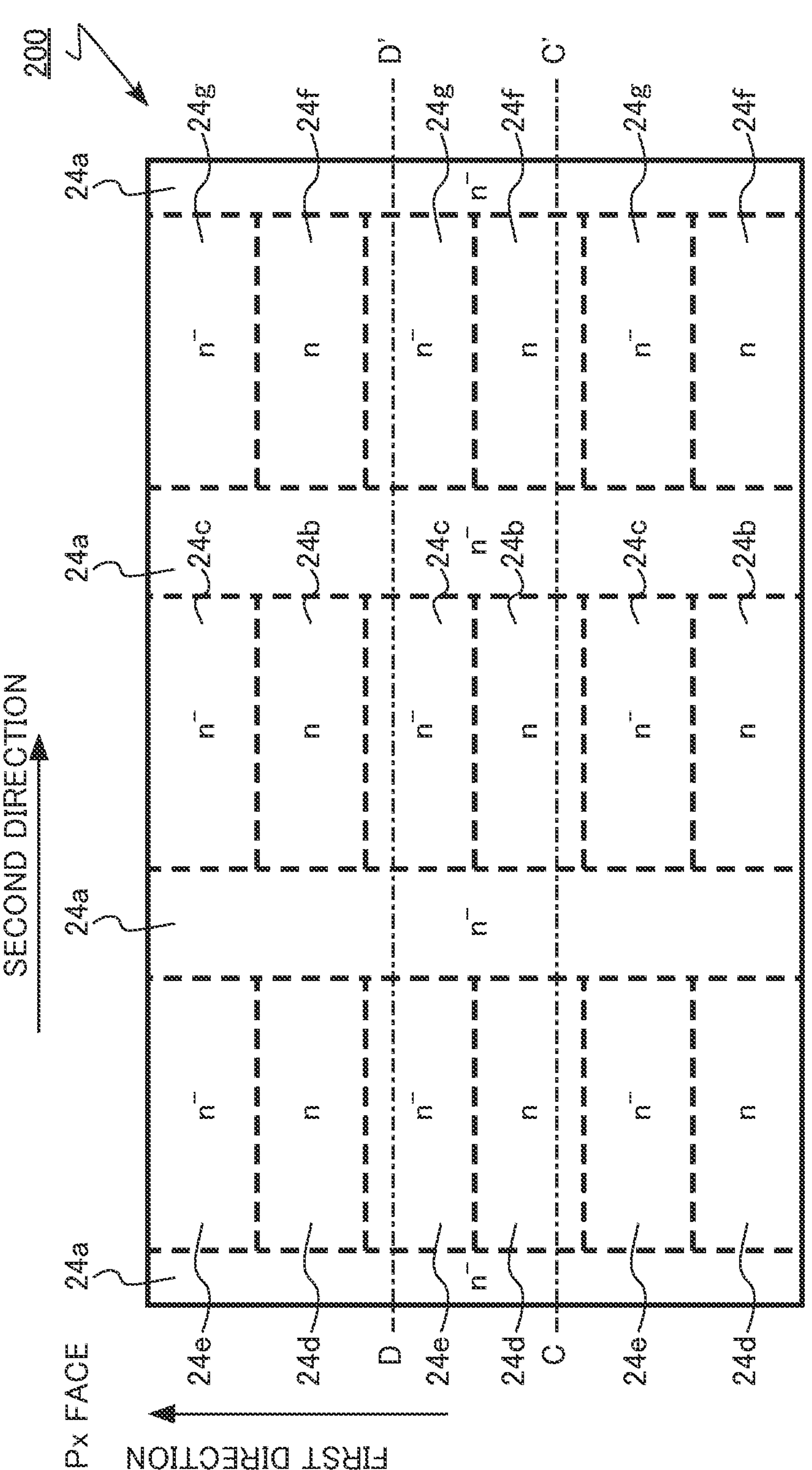
FIG. 13 is a schematic sectional view of the semiconductor device according to the second embodiment.

FIGS. 9 and 10 are schematic sectional views of the semiconductor device according to the second embodiment. FIG. 11 is a schematic top view of the second embodiment. FIG. 11 is a view of the pattern of the gate electrode overlaid with the pattern of the silicon carbide region on the front surface of the silicon carbide layer. FIGS. 12 and 13 are schematic sectional views of the semiconductor device according to the second embodiment.

FIG. 9 is a cross-section taken along line CC' of FIGS. 11 and 13. FIG. 10 is a cross-section taken along line DD' of FIGS. 11 and 13. FIG. 12 is a sectional view taken along face Py of FIGS. 9 and 10. FIG. 13 is a sectional view taken along face Px of FIGS. 9 and 10.

The semiconductor device according to the second embodiment is a planar-gate-type vertical MOSFET 200 using silicon carbide. The MOSFET 200 of the second embodiment is, for example, a DIMOSFET in which a body region and a source region are formed by ion implantation. In addition, the semiconductor device according to the second embodiment includes a Schottky barrier diode (SBD) as a built-in diode. The MOSFET 200 of the second embodiment is different from the MOSFET 100 of the first embodiment in including an SBD as a built-in diode A case where the first conductivity type is n-type and the second conductivity type is p-type will be described below as an example. The MOSFET 200 is a vertical n-channel MOSFET using electrons as carriers.

The MOSFET 200 includes a silicon carbide layer 10, a source electrode 12, a drain electrode 14, a gate insulating layer 16, a gate electrode 18, and an interlayer insulating layer 20. The source electrode 12 is an example of a first electrode. The drain electrode 14 is an example of a second electrode.

In the silicon carbide layer 10, an $n^+$ type drain region 22, an $n^-$ type drift region 24, a p-type first body region 26*a*, a p-type second body region 26*b*, a p-type third body region 26*c*, an $n^+$ type source region 28, and a $p^+$ type body contact region 30 are provided. The drift region 24 is an example of a first silicon carbide region. The first body region 26*a* is an example of a second silicon carbide region. The second body region 26*b* is an example of a fourth silicon carbide region. The source region 28 is an example of a third silicon carbide region.

The drift region 24 includes a main region 24*a*, a first high-concentration region 24*b*, a first low-concentration region 24*c*, a second high-concentration region 24*d*, a second low-concentration region 24*e*, a third high-concentration region 24*f*, and a third low-concentration region 24*g*. The main region 24*a* is an example of a first region. The first high-concentration region 24*b* is an example of a second region. The first low-concentration region 24*c* is an example of a third region. The second high-concentration region 24*d* is an example of a fourth region. The second low-concentration region 24*e* is an example of a fifth region.

The p-type first body region 26*a*, second body region 26*b*, and third body region 26*c* are provided between the drift region 24 and the first face P1. The first body region 26*a*, the second body region 26*b*, and the third body region 26*c* are separated from each other.

The first body region 26*a*, the second body region 26*b*, and the third body region 26*c* extend in the first direction parallel to the first face P1. The second body region 26*b* and the third body region 26*c* are provided in the second direction parallel to the first face P1 and orthogonal to the first direction with respect to the first body region 26*a*. The first body region 26*a* is provided between the second body region 26*b* and the third body region 26*c*.

The first body region 26*a*, the second body region 26*b*, and the third body region 26*c* function as the channel regions of the MOSFET 200.

The first body region 26*a*, the second body region 26*b*, and the third body region 26*c* contain, for example, aluminum (Al) as p-type impurities. The p-type impurity concentration in the first body region 26*a*, the second body region 26*b*, and the third body region 26*c* is, for example, $1\times10^{17}$ $cm^{-3}$ or more and $1\times10^{18}$ $cm^{-3}$ or less.

The depths of the first body region 26*a*, the second body region 26*b*, and the third body region 26*c* are, for example, 0.3 μm or more and 0.8 μm or less.

The first body region 26*a*, the second body region 26*b*, and the third body region 26*c* are fixed to the electric potential of the source electrode 12.

The n-type drift region 24 is provided between the drain region 22 and the first face P1. The n-type drift region 24 includes a first portion 24*x*. The first portion 24*x* is, for example, a part of the main region 24*a*.

The first portion 24*x* is in contact with the first face P1. The first portion 24*x* is provided between the first body region 26*a* and the third body region 26*c*. The first portion 24*x* is in contact with the first body region 26*a* and the third body region 26*c*.

The source electrode 12 is in contact with the source region 28. The source electrode 12 is in contact with the body contact region 30.

The source electrode 12 is in contact with the first portion 24*x* of the drift region 24. The source electrode 12 is in contact with the first body region 26*a* adjacent to the first portion 24*x*. The source electrode 12 is in contact with the third body region 26*c* adjacent to the first portion 24*x*.

The source electrode 12 contains metal. The metal forming the source electrode 12 is, for example, a stacked structure of titanium (Ti) and aluminum (Al). A portion of the source electrode 12 in contact with the source region 28 is, for example, metal silicide. The metal silicide is, for example, titanium silicide or nickel silicide. For example, metal silicide is not provided in a portion of the source electrode 12 in contact with the first portion 24*x*.

The junction between the first portion 24*x* and the source electrode 12 is a Schottky junction.

The source electrode 12, the first portion 24*x*, the main region 24*a*, the drain region 22, and the drain electrode 14 constitute an SBD. The source electrode 12 functions as an anode electrode of the SBD, and the drain electrode 14 functions as a cathode electrode of the SBD.

The drift region 24 includes an n-type main region 24*a*, a plurality of n-type first high-concentration regions 24*b*, a plurality of n-type first low-concentration regions 24*c*, a plurality of n-type second high-concentration regions 24*d*, a plurality of n-type second low-concentration regions 24*e*, a plurality of n-type third high-concentration regions 24*f*, and a plurality of n-type third low-concentration regions 24*g*.

The main region 24*a* contains, for example, nitrogen (N) as n-type impurities. The n-type impurity concentration in the main region 24*a* is, for example, $4\times10^{14}$ $cm^{-3}$ or more and $1\times10^{17}$ $cm^{-3}$ or less.

The plurality of third high-concentration regions 24*f* are provided between the main region 24*a* and the third body region 26*c*. The plurality of third high-concentration regions 24*f* are in contact with the third body region 26*c*. The plurality of third high-concentration regions 24*f* are in contact with, for example, the main region 24*a*.

The plurality of third low-concentration regions 24*g* are provided between the main region 24*a* and the third body region 26*c*. The plurality of third low-concentration regions 24*g* are in contact with the third body region 26*c*. The third low-concentration region 24*g* is in contact with the main region 24*a*, for example.

As illustrated in FIG. 12, the third body region 26*c* extends in the first direction. As illustrated in FIG. 13, the third high-concentration regions 24*f* and the third low-concentration regions 24*g* are alternately provided in the first direction. One third low-concentration region 24*g* is sandwiched between two third high-concentration regions 24*f* in the first direction. The third high-concentration region 24*f* and the third low-concentration region 24*g* are in contact with each other.

The third high-concentration region 24*f* is provided in the second direction of the first high-concentration region 24*b*. The third low-concentration region 24*g* is provided in the second direction of the first low-concentration region 24*c*.

The third high-concentration region 24*f* contains, for example, nitrogen (N) as n-type impurities. The n-type impurity concentration in the third high-concentration region 24*f* is higher than the n-type impurity concentration in the main region 24*a*. The n-type impurity concentration in the third high-concentration region 24*f* is higher than the n-type impurity concentration in the third low-concentration region 24*g*. The n-type impurity concentration in the third high-concentration region 24*f* is equal to the n-type impurity concentration in the first high-concentration region 24*b*, for example.

The n-type impurity concentration in the third high-concentration region 24*f* is, for example, $5\times10^{16}$ $cm^{-3}$ or more and $1\times10^{18}$ $cm^{-3}$ or less.

The third low-concentration region 24*g* contains, for example, nitrogen (N) as n-type impurities. The n-type impurity concentration in the third low-concentration region 24*g* is equal to or higher than the n-type impurity concentration in the main region 24*a*. The n-type impurity concentration in the third low-concentration region 24*g* is higher than the n-type impurity concentration in the main region 24*a*, for example. The n-type impurity concentration in the third low-concentration region 24*g* is equal to the n-type impurity concentration in the first low-concentration region 24*c*, for example.

The n-type impurity concentration in the third low-concentration region 24*g* is, for example, $4\times10^{14}$ $cm^{-3}$ or more and $1\times10^{17}$ $cm^{-3}$ or less.

Next, functions and effects of the MOSFET 200 of the second embodiment will be described.

In the MOSFET 200 according to the second embodiment, similarly to the MOSFET 100 according to the first embodiment, the drift region 24 includes the first high-concentration region 24*b*, the first low-concentration region 24*c*, the second high-concentration region 24*d*, and the second low-concentration region 24*e*, so that the product (Ron×Qoss) of the on-resistance and the output charge amount is reduced.

Figure 14:
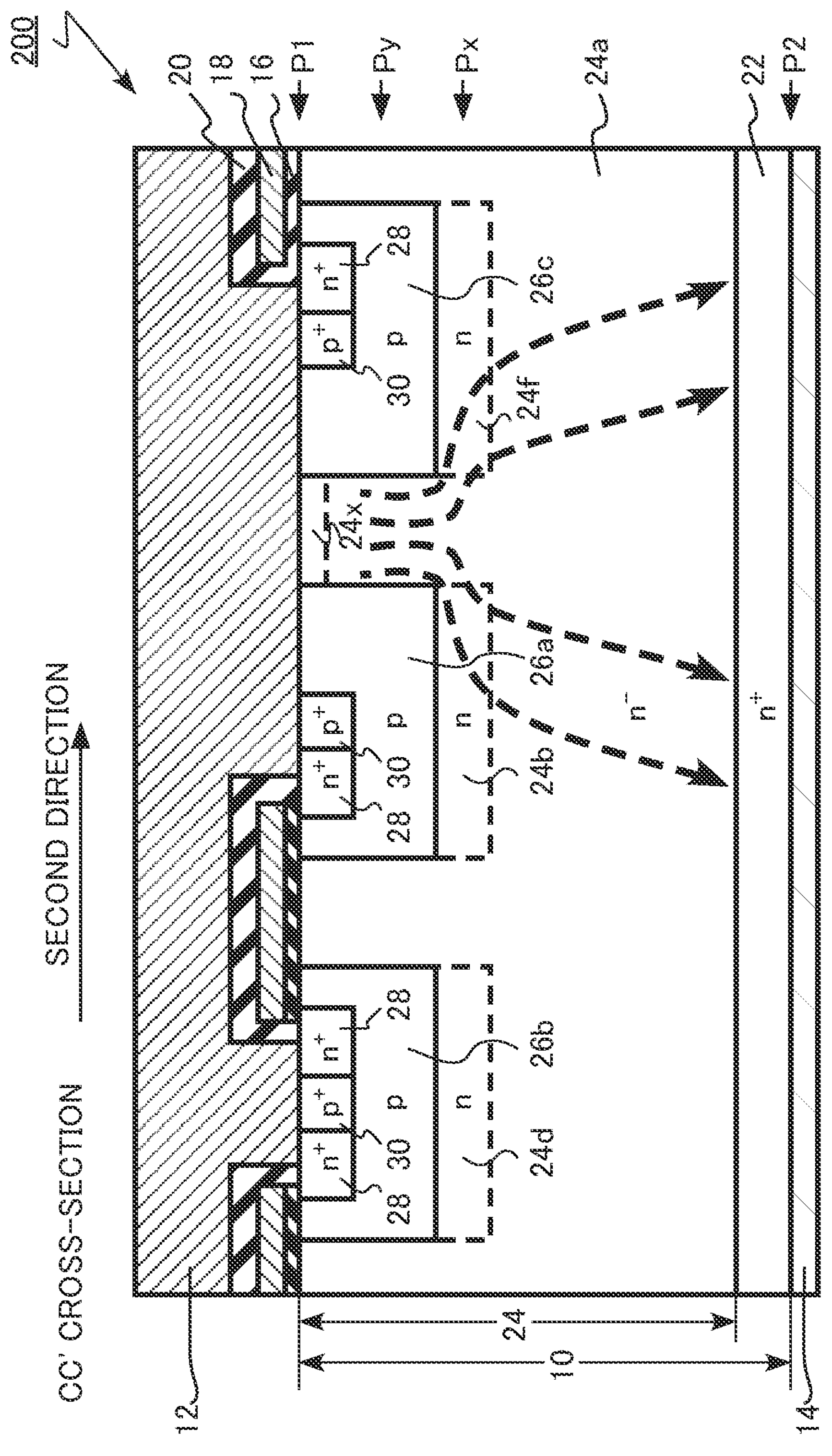
FIG. 14 is an explanatory diagram of functions and effects of the semiconductor device according to the second embodiment.

FIG. 14 is an explanatory diagram of functions and effects of the semiconductor device according to the second embodiment. FIG. 14 is a schematic sectional view of the MOSFET 200 of the second embodiment. FIG. 14 is a cross-section corresponding to FIG. 9.

FIG. 14 is a diagram illustrating a path of an on-current flowing through the SBD of the MOSFET 200 of the second embodiment. In the MOSFET 200 according to the second embodiment, immediately below the first body region 26*a* and the third body region 26*c*, the first high-concentration region 24*b* and the third high-concentration region 24*f* with high n-type impurity concentration and low electrical resistance are provided. Hence the on-current of the SBD is more likely to spread immediately below the first body region 26*a* and the third body region 26*c*. This enables an increase in the on-current of the SBD built in the MOSFET 200.

As described above, according to the second embodiment, similarly to the first embodiment, it is possible to achieve a semiconductor device capable of reducing the product (Ron×Qoss) of the on-resistance and the output charge amount. In addition, it is possible to increase the on-current of the built-in SBD.

Third Embodiment

A semiconductor device according to a third embodiment is different from the semiconductor device according to the first embodiment in that the pattern of the gate electrode has a lattice shape. Hereinafter, a part of the description of contents overlapping with those of the first embodiment will be omitted.

Figure 15A:
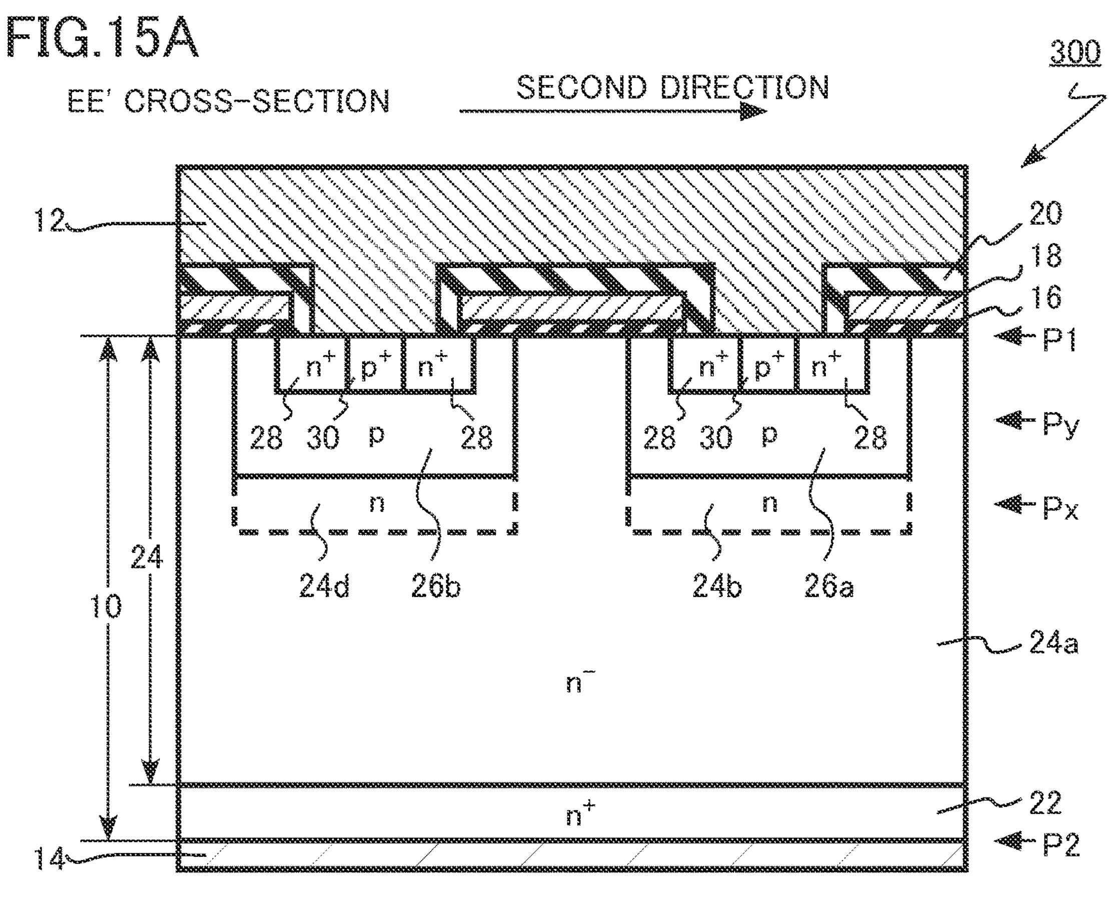
FIGS. 15A and 15B are schematic sectional views of a semiconductor device according to a third embodiment.
Figure 15B:
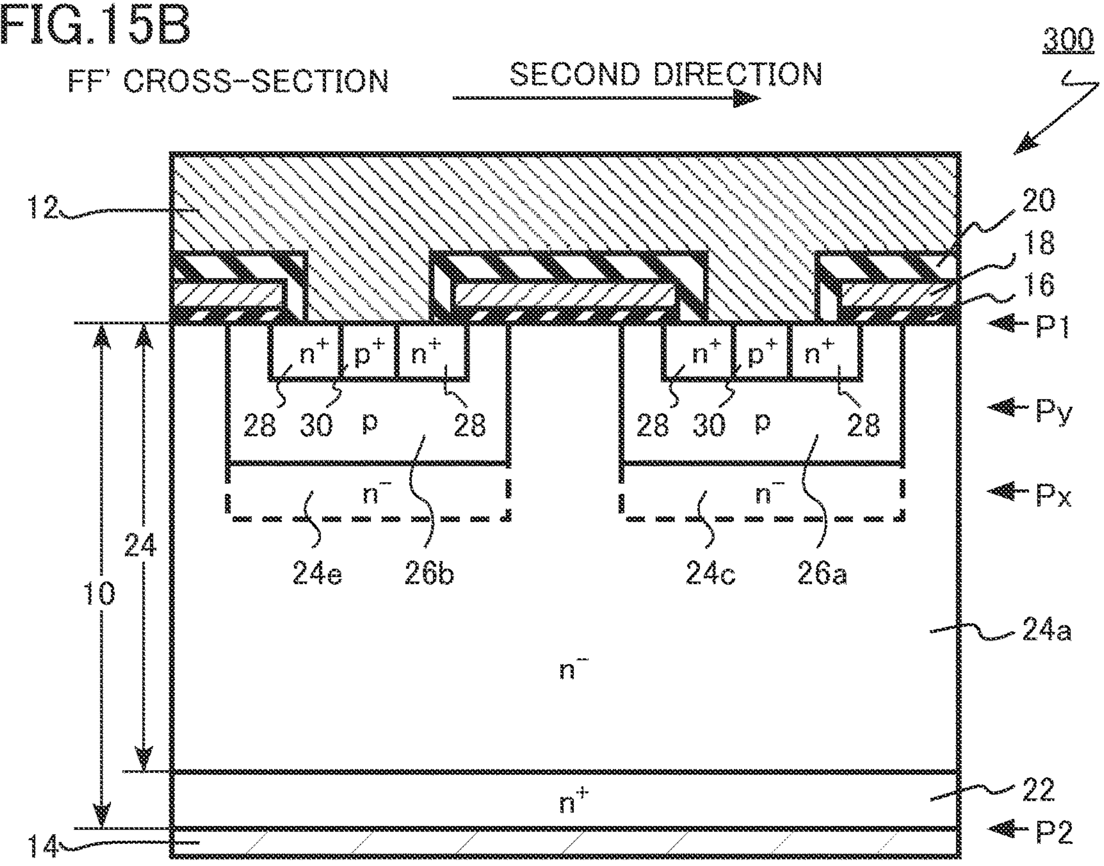
Figure 16:
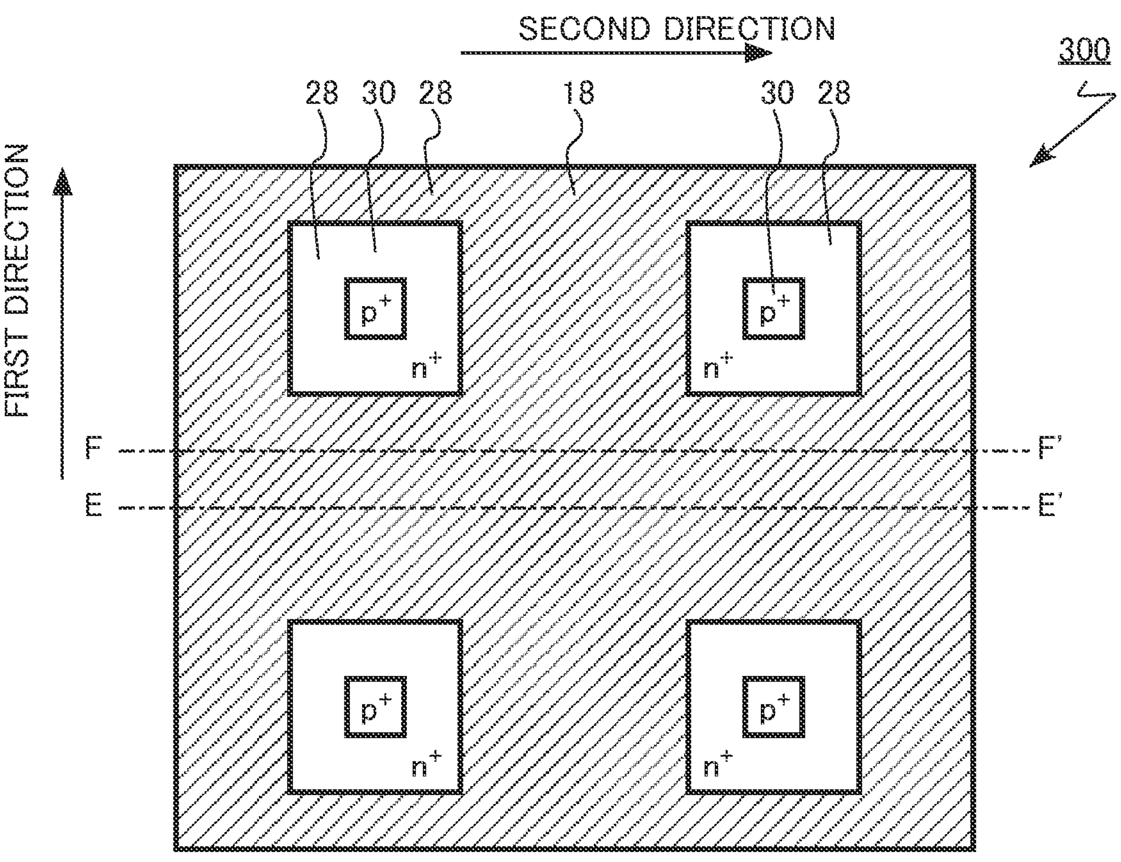
FIG. 16 is a schematic top view of the third embodiment.
Figure 17A:
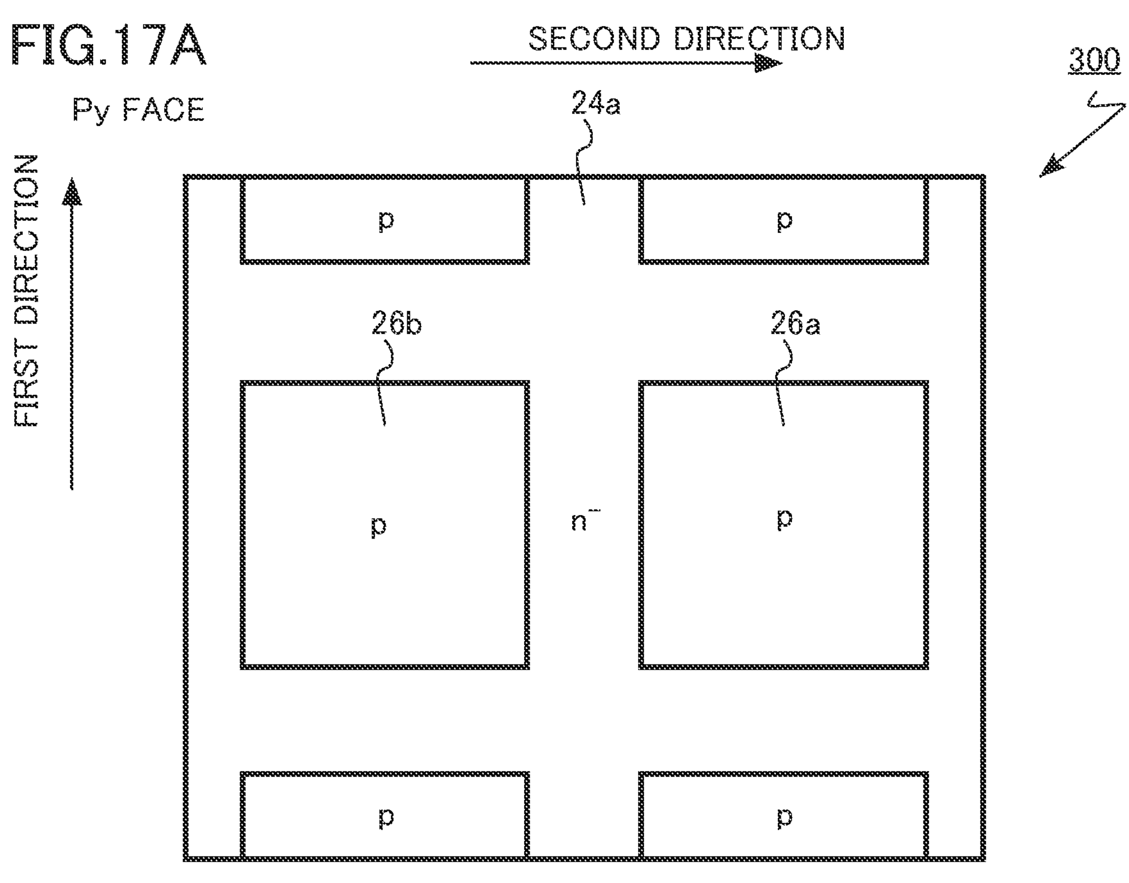
FIGS. 17A and 17B are schematic sectional views of the semiconductor device according to the third embodiment.
Figure 17B:
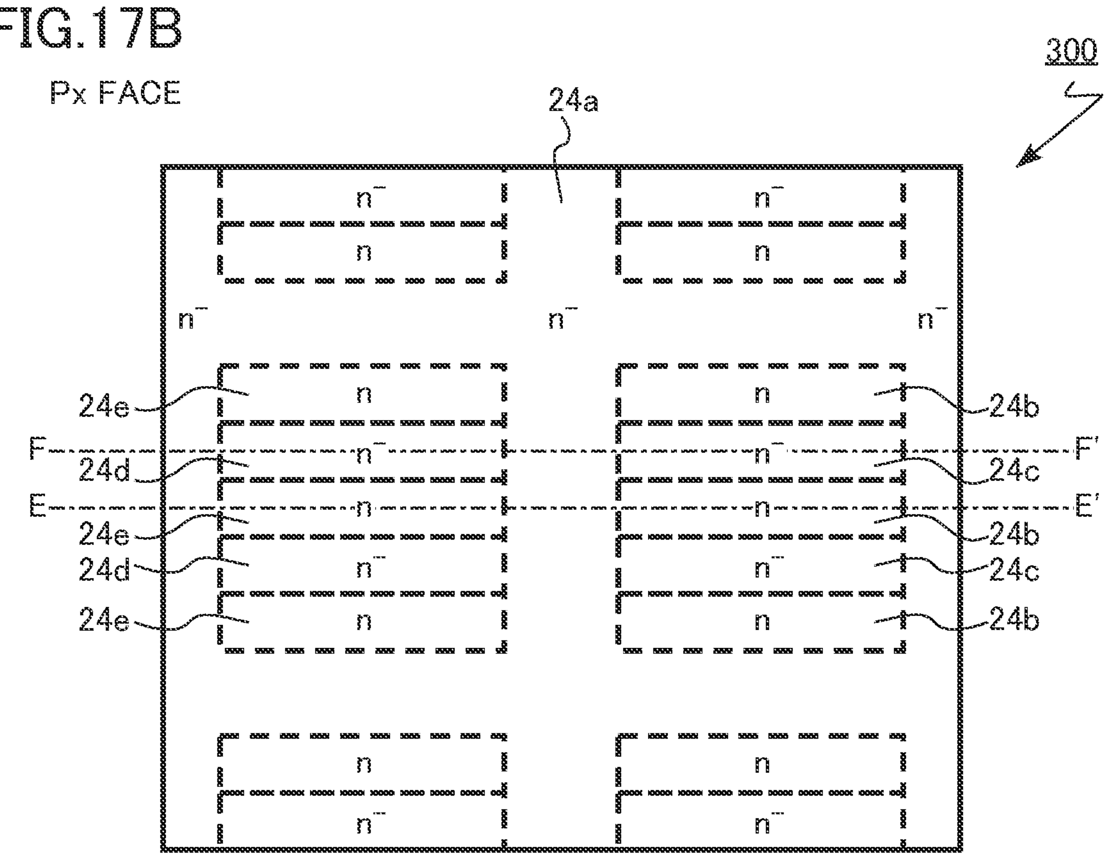

FIGS. 15A and 15B are schematic sectional views of the semiconductor device according to the third embodiment. FIG. 16 is a schematic top view of the third embodiment. FIG. 16 is a view of the pattern of the gate electrode overlaid with the pattern of the silicon carbide region on the front surface of the silicon carbide layer. FIGS. 17A and 17B are schematic sectional views of the semiconductor device according to the third embodiment.

FIG. 15A is a cross-section taken along line EE' of FIGS. 16 and 17B. FIG. 15B is a cross-section taken along line FF' of FIGS. 16 and 17B. FIG. 17A is a sectional view taken along face Py of FIGS. 15A and 15B. FIG. 17B is a sectional view taken along face Px of FIGS. 15A and 15B.

The semiconductor device according to the third embodiment is a planar-gate-type vertical MOSFET 300 using silicon carbide. The MOSFET 300 of the third embodiment is, for example, a DIMOSFET in which a body region and a source region are formed by ion implantation.

A case where the first conductivity type is n-type and the second conductivity type is p-type will be described below as an example. The MOSFET 300 is a vertical n-channel MOSFET using electrons as carriers.

The MOSFET 300 includes a silicon carbide layer 10, a source electrode 12, a drain electrode 14, a gate insulating layer 16, a gate electrode 18, and an interlayer insulating layer 20. The source electrode 12 is an example of a first electrode. The drain electrode 14 is an example of a second electrode.

In the silicon carbide layer 10, an $n^+$ type drain region 22, an $n^-$ type drift region 24, a p-type first body region 26*a*, a p-type second body region 26*b*, an $n^+$ type source region 28, and a $p^+$ type body contact region 30 are provided. The drift region 24 is an example of a first silicon carbide region. The first body region 26*a* is an example of a second silicon carbide region. The second body region 26*b* is an example of a fourth silicon carbide region. The source region 28 is an example of a third silicon carbide region.

The drift region 24 includes a main region 24*a*, a first high-concentration region 24*b*, a first low-concentration region 24*c*, a second high-concentration region 24*d*, and a second low-concentration region 24*e*. The main region 24*a* is an example of a first region. The first high-concentration region 24*b* is an example of a second region. The first low-concentration region 24*c* is an example of a third region. The second high-concentration region 24*d* is an example of a fourth region. The second low-concentration region 24*e* is an example of a fifth region.

As illustrated in FIG. 16, the gate electrode 18 has a lattice-shaped pattern. As illustrated in FIG. 17A, the p-type first body region 26*a* and the p-type second body region 26*b* each have a square pattern.

As illustrated in FIG. 17B, the first high-concentration regions 24*b* and the first low-concentration regions 24*c* are alternately provided in the first direction immediately below first body region 26*a*. The second high-concentration regions 24*d* and the second low-concentration regions 24*e* are alternately provided in the first direction immediately below the second body region 26*b*.

In the MOSFET 300 of the third embodiment, similarly to the MOSFET 100 of the first embodiment, the drift region 24 includes the first high-concentration region 24*b*, the first low-concentration region 24*c*, the second high-concentration region 24*d*, and the second low-concentration region 24*e*, so that the product (Ron×Qoss) of the on-resistance and the output charge amount is reduced.

As described above, according to the third embodiment, similarly to the first embodiment, it is possible to achieve a semiconductor device capable of reducing the product (Ron×Qoss) of the on-resistance and the output charge amount.

Fourth Embodiment

A semiconductor device according to a fourth embodiment includes: a silicon carbide layer having a first face and a second face facing the first face; a first electrode provided on a side of the first face of the silicon carbide layer; a second electrode provided on a side of the second face of the silicon carbide layer; a first silicon carbide region of a first conductivity type provided in the silicon carbide layer; a second silicon carbide region of a second conductivity type provided in the silicon carbide layer and provided between the first silicon carbide region and the first face; a third silicon carbide region of the first conductivity type provided in the silicon carbide layer and provided between the second silicon carbide region and the first face, the third silicon carbide region being in contact with the first electrode; a trench provided in the silicon carbide layer, the trench being in contact with the first silicon carbide region, the second silicon carbide region, and the third silicon carbide region; a gate electrode provided in the trench and facing the second silicon carbide region; and a gate insulating layer provided between the gate electrode and the second silicon carbide region. The first silicon carbide region includes a first region, a plurality of second regions provided between the first region and the second silicon carbide region and in contact with the second silicon carbide region, and a plurality of third regions provided between the first region and the second silicon carbide region and in contact with the second silicon carbide region. The second regions and the third regions are alternately provided in a first direction parallel to the first face. A first conductivity type impurity concentration in each of the second regions is higher than a first conductivity type impurity concentration in the first region and a first conductivity type impurity concentration in each of the third regions. A semiconductor device according to a fourth embodiment is different from the semiconductor device according to the first embodiment in that the semiconductor device has a trench gate structure. Hereinafter, a part of the description of contents overlapping with those of the first embodiment will be omitted.

Figure 18A:
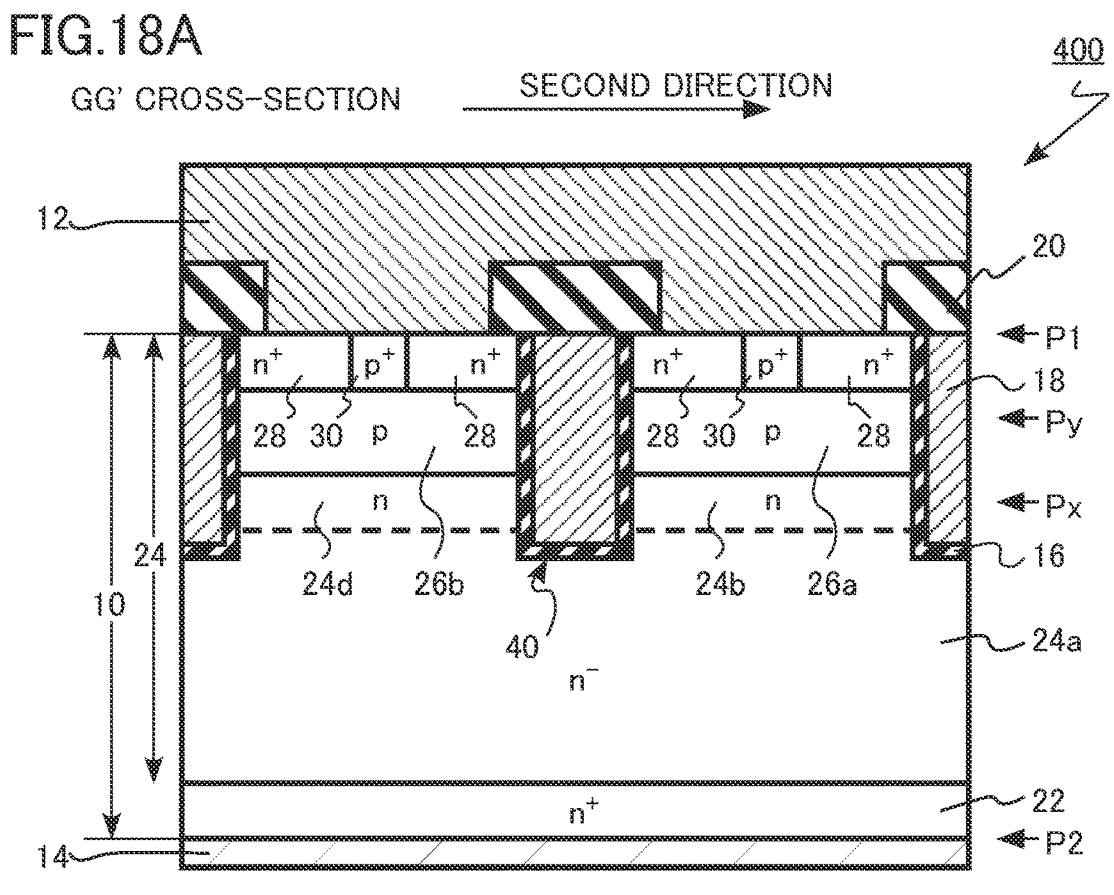
FIGS. 18A and 18B are schematic sectional views of a semiconductor device according to a fourth embodiment.
Figure 18B:
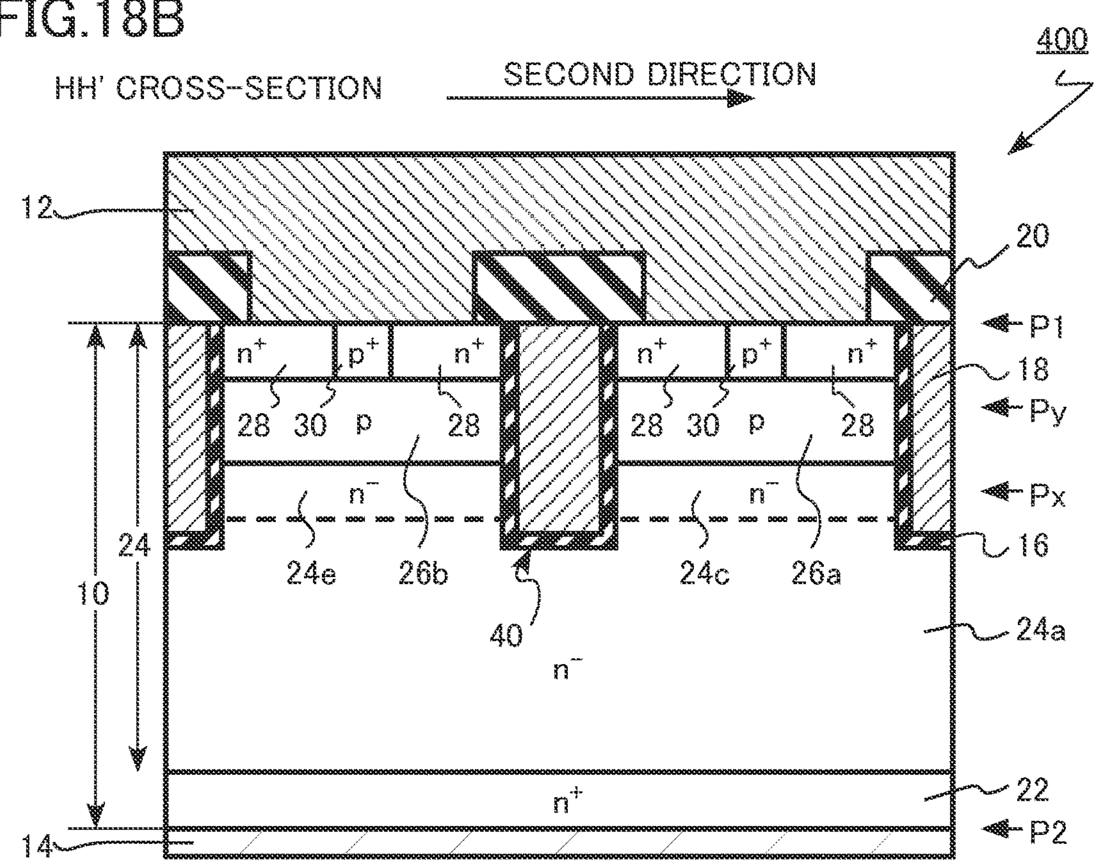
Figure 19:
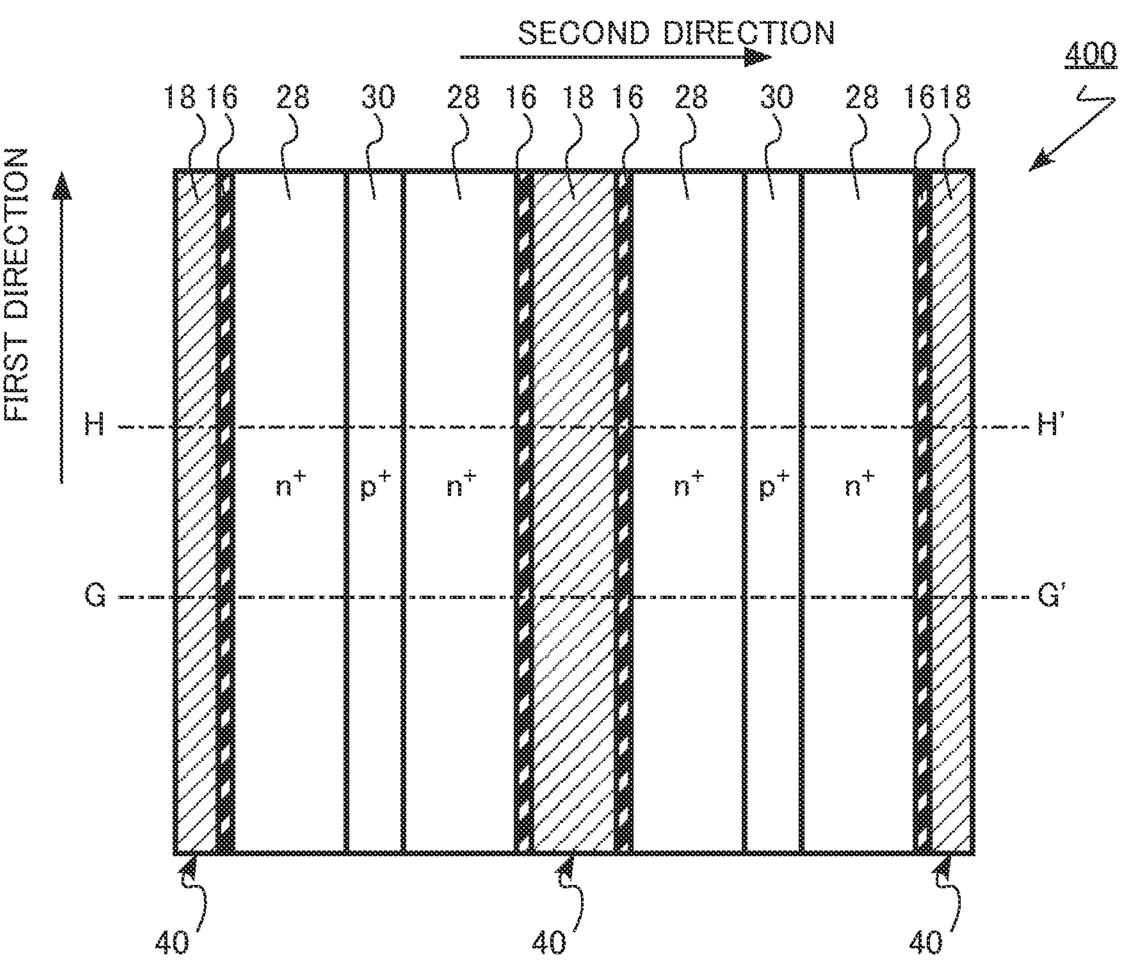
FIG. 19 is a schematic top view of the fourth embodiment.
Figure 20A:
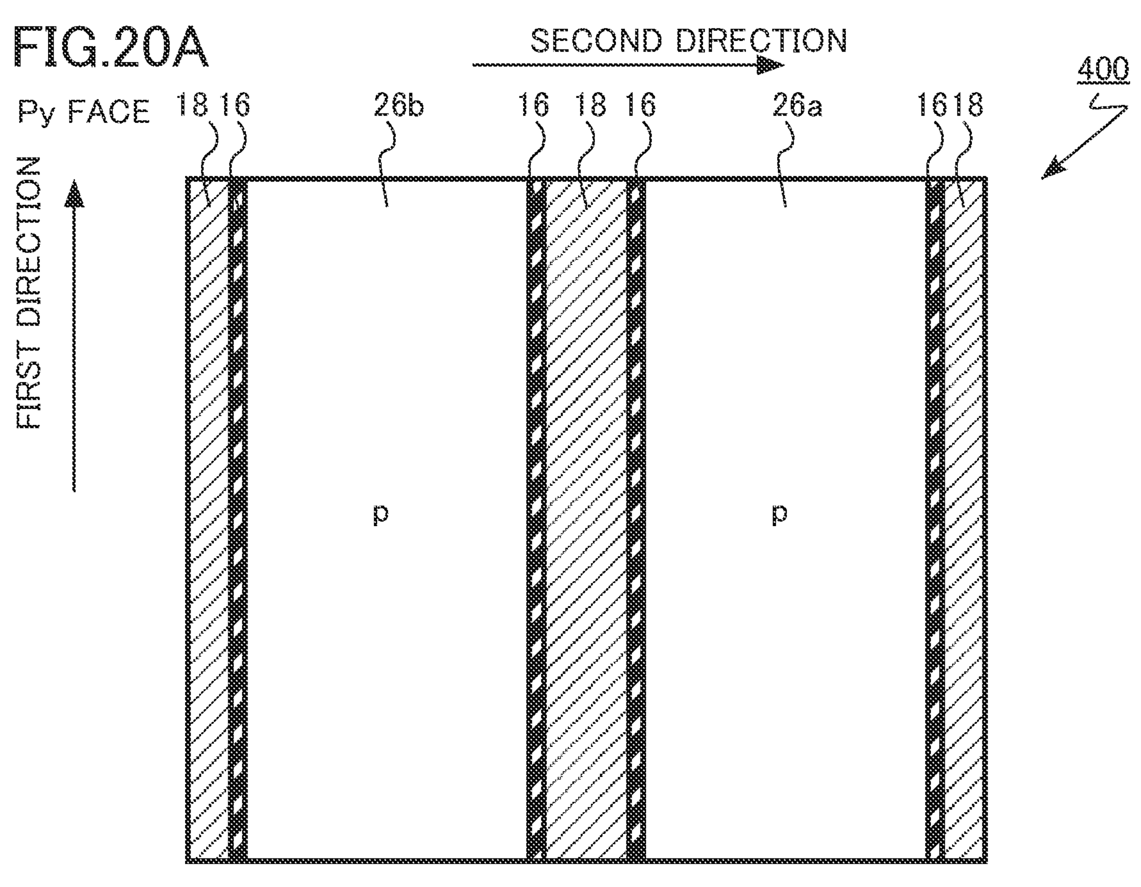
FIGS. 20A and 20B are schematic sectional views of the semiconductor device according to the fourth embodiment.
Figure 20B:
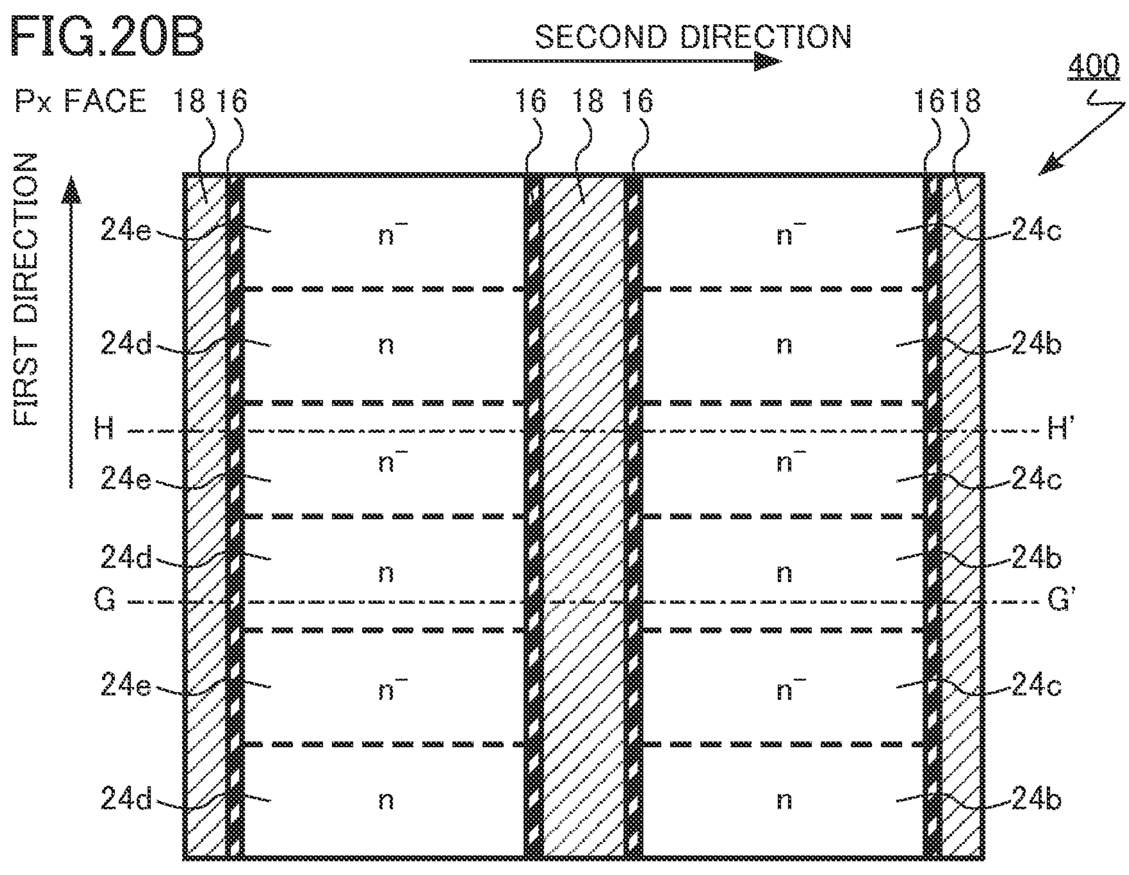

FIGS. 18A and 18B are schematic sectional views of the semiconductor device according to the fourth embodiment. FIG. 19 is a schematic top view of the fourth embodiment. FIG. 19 is a view of the patterns of the trench and the gate electrode overlaid with the pattern of the silicon carbide region on the front surface of the silicon carbide layer. FIGS. 20A and 20B are schematic sectional views of the semiconductor device according to the fourth embodiment.

FIG. 18A is a cross-section taken along line GG' of FIGS. 19 and 20B. FIG. 18B is a cross-section taken along line HH' of FIGS. 19 and 20B. FIG. 20A is a sectional view taken along face Py of FIGS. 18A and 18B. FIG. 20B is a sectional view taken along face Px of FIGS. 18A and 18B.

The semiconductor device according to the fourth embodiment is a trench-gate-type vertical MOSFET 400 using silicon carbide. In the MOSFET 400 of the fourth embodiment, a gate electrode is formed in a trench provided in a silicon carbide layer.

A case where the first conductivity type is n-type and the second conductivity type is p-type will be described below as an example. The MOSFET 400 is a vertical n-channel MOSFET using electrons as carriers.

The MOSFET 400 includes a silicon carbide layer 10, a source electrode 12, a drain electrode 14, a gate insulating layer 16, a gate electrode 18, and an interlayer insulating layer 20. The source electrode 12 is an example of a first electrode. The drain electrode 14 is an example of a second electrode.

In the silicon carbide layer 10, an $n^+$ type drain region 22, an $n^-$ type drift region 24, a p-type first body region 26*a*, a p-type second body region 26*b*, an $n^+$ type source region 28, a $p^+$ type body contact region 30, and a trench 40 are provided. The drift region 24 is an example of a first silicon carbide region. The first body region 26*a* is an example of a second silicon carbide region. The second body region 26*b* is an example of a fourth silicon carbide region. The source region 28 is an example of a third silicon carbide region.

The drift region 24 includes a main region 24*a*, a first high-concentration region 24*b*, a first low-concentration region 24*c*, a second high-concentration region 24*d*, and a second low-concentration region 24*e*. The main region 24*a* is an example of a first region. The first high-concentration region 24*b* is an example of a second region. The first low-concentration region 24*c* is an example of a third region. The second high-concentration region 24*d* is an example of a fourth region. The second low-concentration region 24*e* is an example of a fifth region.

The trench 40 is provided in the silicon carbide layer 10. The trench 40 is a part of the silicon carbide layer 10. The trench 40 is a recess formed in the silicon carbide layer 10.

The trench 40 is in contact with the drift region 24, the first body region 26*a*, the second body region 26*b*, and the source region 28. The trench 40 penetrates the drift region 24, the first body region 26*a*, and the second body region 26*b*.

The gate electrode 18 is provided in the silicon carbide layer 10. The gate electrode 18 is provided in the silicon carbide layer 10 with the gate insulating layer 16 interposed therebetween. The gate electrode 18 is provided in the trench 40. The gate electrode 18 faces the first body region 26*a*. The gate electrode 18 faces the second body region 26*b*.

The gate insulating layer 16 is provided between the gate electrode 18 and the first body region 26*a*. The gate insulating layer 16 is provided between the gate electrode 18 and the second body region 26*b*.

As illustrated in FIG. 19, the trench 40 and the gate electrode 18 extend in the first direction. The trench 40 and the gate electrode 18 each have a stripe pattern. As illustrated in FIG. 20A, the p-type first body region 26*a* and the p-type second body region 26*b* extend in the first direction.

As illustrated in FIG. 20B, the first high-concentration regions 24*b* and the first low-concentration regions 24*c* are alternately provided in the first direction immediately below first body region 26*a*. The second high-concentration regions 24*d* and the second low-concentration regions 24*e* are alternately provided in the first direction immediately below the second body region 26*b*.

In the MOSFET 400 according to the fourth embodiment, similarly to the MOSFET 100 according to the first embodiment, the drift region 24 includes the first high-concentration region 24*b*, the first low-concentration region 24*c*, the second high-concentration region 24*d*, and the second low-concentration region 24*e*, so that the product (Ron×Qoss) of the on-resistance and the output charge amount is reduced.

As described above, according to the fourth embodiment, similarly to the first embodiment, it is possible to achieve a semiconductor device capable of reducing the product (Ron×Qoss) of the on-resistance and the output charge amount.

In the first to fourth embodiments, the case of 4H—SiC has been described as an example of the crystal structure of SiC, but the present disclosure can also be applied to devices using SiC with other crystal structures such as 6H—SiC and 3C—SiC. It is also possible to apply a face other than the (0001) face to the surface of the silicon carbide layer 10.

In the first to fourth embodiments, the case where the first conductivity type is n-type and the second conductivity type is p-type has been described as an example, but the first conductivity type may be p-type and the second conductivity type may be n-type.

In the first to fourth embodiments, aluminum (Al) is exemplified as the p-type impurity, but boron (B) can also be used. Further, nitrogen (N) and phosphorus (P) have been exemplified as the n-type impurities, but arsenic (As), antimony (Sb), and the like can also be applied.

In the second embodiment, the case where the semiconductor device is a planar-gate-type MOSFET with a built-in SBD has been described as an example, but the semiconductor device may be, for example, a trench-gate-type MOSFET with a built-in SBD.

In the first to fourth embodiments, the case where the semiconductor device is a MOSFET has been described as an example, but the semiconductor device may be an insulated-gate bipolar transistor (IGBT).

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:

a silicon carbide layer having a first face and a second face facing the first face;

a first electrode provided on a side of the first face of the silicon carbide layer;

a second electrode provided on a side of the second face of the silicon carbide layer;

a first silicon carbide region of a first conductivity type provided in the silicon carbide layer;

a second silicon carbide region of a second conductivity type provided in the silicon carbide layer and provided between the first silicon carbide region and the first face;

a third silicon carbide region of the first conductivity type provided in the silicon carbide layer and provided between the second silicon carbide region and the first face, the third silicon carbide region being in contact with the first electrode;

a first gate electrode provided on the first face side of the silicon carbide layer and facing the second silicon carbide region, the first gate electrode extending in a first direction parallel to the first face;

a second gate electrode provided on the first face side of the silicon carbide layer, the second gate electrode extending in the first direction, the second gate electrode being separated from the first gate electrode in a second direction parallel to the first face and orthogonal to the first direction; and a gate insulating layer provided between the first gate electrode and the second silicon carbide region, wherein the first silicon carbide region includes a first region, a plurality of second regions provided between the first region and the second silicon carbide region and in contact with the second silicon carbide region, and a plurality of third regions provided between the first region and the second silicon carbide region and in contact with the second silicon carbide region, the second regions and the third regions are alternately provided in the first direction, and an impurity concentration in each of the second regions is higher than an impurity concentration in the first region and an impurity concentration in each of the third regions.

2. The semiconductor device according to claim 1, wherein the second silicon carbide region extends in the first direction.

3. The semiconductor device according to claim 1, wherein a length of one of the second regions in the first direction is longer than a length of one of the third regions in the first direction.

4. The semiconductor device according to claim 1, wherein a sum of a length of one of the second regions in the first direction and a length of one of the third region in the first direction is 0.5 times or more and 2 times or less a length of the second silicon carbide region in the second direction.

5. The semiconductor device according to claim 1, wherein an impurity concentration in each of the third regions is higher than an impurity concentration in the first region.

6. The semiconductor device according to claim 1, further comprising a fourth silicon carbide region of the second conductivity type provided in the silicon carbide layer and provided between the first silicon carbide region and the first face, the fourth silicon carbide region being separated from the second silicon carbide region, wherein the first gate electrode faces the fourth silicon carbide region, and the gate insulating layer is provided between the first gate electrode and the fourth silicon carbide region, the first silicon carbide region includes a plurality of fourth regions provided between the first region and the fourth silicon carbide region and in contact with the fourth silicon carbide region, and a plurality of fifth regions provided between the first region and the fourth silicon carbide region and in contact with the fourth silicon carbide region, the fourth regions and the fifth regions are alternately provided in the first direction, and an impurity concentration in each of the fourth regions is higher than an impurity concentration in the first region and an impurity concentration in each of the fifth regions.

7. The semiconductor device according to claim 1, wherein the first silicon carbide region has a first portion in contact with the first face and the second silicon carbide region, and the first electrode is in contact with the first portion.

8. The semiconductor device according to claim 1, wherein a length of the first gate electrode in the first direction is larger than a length of the first gate electrode in the second direction.

9. A semiconductor device comprising:

a silicon carbide layer having a first face and a second face facing the first face;

a first electrode provided on a side of the first face of the silicon carbide layer;

a second electrode provided on a side of the second face of the silicon carbide layer;

a first silicon carbide region of a first conductivity type provided in the silicon carbide layer;

a second silicon carbide region of a second conductivity type provided in the silicon carbide layer and provided between the first silicon carbide region and the first face;

a third silicon carbide region of the first conductivity type provided in the silicon carbide layer and provided between the second silicon carbide region and the first face, the third silicon carbide region being in contact with the first electrode;

a first gate electrode provided in the silicon carbide layer and facing the second silicon carbide region, the first gate electrode extending in a first direction parallel to the first face;

a second gate electrode provided on the first face side of the silicon carbide layer, the second gate electrode extending in the first direction, the second gate electrode being separated from the first gate electrode in a second direction parallel to the first face and orthogonal to the first direction; and a gate insulating layer provided between the gate electrode and the second silicon carbide region, wherein the first silicon carbide region includes a first region, a plurality of second regions provided between the first region and the second silicon carbide region and in contact with the second silicon carbide region, and a plurality of third regions provided between the first region and the second silicon carbide region and in contact with the second silicon carbide region, the second regions and the third regions are alternately provided in the first direction, and an impurity concentration in each of the second regions is higher than an impurity concentration in the first region and an impurity concentration in each of the third regions.

10. The semiconductor device according to claim 9, wherein the second silicon carbide region extends in the first direction.

11. The semiconductor device according to claim 9, wherein a length of the first gate electrode in the first direction is larger than a length of the first gate electrode in the second direction.

12. A semiconductor device comprising:

a silicon carbide layer having a first face and a second face facing the first face;

a first electrode provided on a side of the first face of the silicon carbide layer;

a second electrode provided on a side of the second face of the silicon carbide layer;

a first silicon carbide region of a first conductivity type provided in the silicon carbide layer;

a second silicon carbide region of a second conductivity type provided in the silicon carbide layer and provided between the first silicon carbide region and the first face;

a third silicon carbide region of the first conductivity type provided in the silicon carbide layer and provided between the second silicon carbide region and the first face, the third silicon carbide region being in contact with the first electrode;

a fourth silicon carbide region of the second conductivity type provided in the silicon carbide layer and provided between the first silicon carbide region and the first face, the fourth silicon carbide region being separated from the second silicon carbide region;

a gate electrode provided on the first face side of the silicon carbide layer and facing the second silicon carbide region, the gate electrode facing the fourth silicon carbide region; and a gate insulating layer provided between the gate electrode and the second silicon carbide region, the gate insulating layer provided between the gate electrode and the fourth silicon carbide region, wherein the first silicon carbide region includes a first region, a plurality of second regions provided between the first region and the second silicon carbide region and in contact with the second silicon carbide region, and a plurality of third regions provided between the first region and the second silicon carbide region and in contact with the second silicon carbide region, a plurality of fourth regions provided between the first region and the fourth silicon carbide region and in contact with the fourth silicon carbide region, and a plurality of fifth regions provided between the first region and the fourth silicon carbide region and in contact with the fourth silicon carbide region, the second regions and the third regions are alternately provided in a first direction parallel to the first face, an impurity concentration in each of the second regions is higher than an impurity concentration in the first region and an impurity concentration in each of the third regions, the fourth regions and the fifth regions are alternately provided in the first direction, and an impurity concentration in each of the fourth regions is higher than an impurity concentration in the first region and an impurity concentration in each of the fifth regions.

13. The semiconductor device according to claim 12, wherein the second silicon carbide region extends in the first direction.

14. The semiconductor device according to claim 12, wherein the gate electrode extends in the first direction.

15. The semiconductor device according to claim 12, wherein a length of one of the second regions in the first direction is longer than a length of one of the third regions in the first direction.

16. The semiconductor device according to claim 12, wherein a sum of a length of one of the second regions in the first direction and a length of one of the third region in the first direction is 0.5 times or more and 2 times or less a length of the second silicon carbide region in a second direction perpendicular to the first direction and parallel to the first face.

17. The semiconductor device according to claim 12, wherein an impurity concentration in each of the third regions is higher than an impurity concentration in the first region.

18. The semiconductor device according to claim 12, wherein the first silicon carbide region has a first portion in contact with the first face and the second silicon carbide region, and the first electrode is in contact with the first portion.

19. The semiconductor device according to claim 12, wherein a length of the gate electrode in the first direction is larger than a length of the gate electrode in a second direction parallel to the first face and orthogonal to the first direction.

* * * * *